(12) United States Patent
Kim et al.

(10) Patent No.: US 12,073,045 B2
(45) Date of Patent: Aug. 27, 2024

(54) INPUT SENSING PART AND DISPLAY DEVICE INCLUDING THE SAME

(71) Applicant: SAMSUNG DISPLAY CO., LTD., Yongin-si (KR)

(72) Inventors: Hyungbae Kim, Hwaseong-si (KR); Hyun-Wook Cho, Yongin-si (KR); Sangkook Kim, Cheonan-si (KR); Taejoon Kim, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 44 days.

(21) Appl. No.: 18/155,041

(22) Filed: Jan. 16, 2023

(65) Prior Publication Data

US 2023/0305659 A1 Sep. 28, 2023

(30) Foreign Application Priority Data

Mar. 28, 2022 (KR) .................... 10-2022-0038197

(51) Int. Cl.
*G06F 3/041* (2006.01)
*H10K 59/40* (2023.01)
*H10K 59/80* (2023.01)
*G06F 3/044* (2006.01)

(52) U.S. Cl.
CPC .......... *G06F 3/0418* (2013.01); *G06F 3/0412* (2013.01); *G06F 3/04164* (2019.05); *H10K 59/40* (2023.02); *H10K 59/873* (2023.02); *G06F 3/0446* (2019.05); *G06F 2203/04107* (2013.01); *G06F 2203/04111* (2013.01); *G06F 2203/04112* (2013.01)

(58) Field of Classification Search
CPC .. G06F 3/0418; G06F 3/04164; G06F 3/0412; G06F 3/0446; G06F 2203/04107; G06F 2203/04111; G06F 2203/04112; H10K 59/40; H10K 59/873
See application file for complete search history.

(56) References Cited

U.S. PATENT DOCUMENTS

| | | | |
|---|---|---|---|
| 9,524,064 | B2 | 12/2016 | Kim et al. |
| 2021/0223934 | A1* | 7/2021 | Kim ........................ H04B 5/77 |
| 2022/0067878 | A1 | 2/2022 | Cho et al. |
| 2023/0185400 | A1* | 6/2023 | Park ...................... G06F 3/0445 |
| | | | 345/173 |

FOREIGN PATENT DOCUMENTS

| | | |
|---|---|---|
| CN | 114078922 | 2/2022 |
| KR | 10-2017-0081068 | 7/2017 |
| KR | 10-1993220 | 6/2019 |
| KR | 10-2022-023895 | 3/2022 |

* cited by examiner

*Primary Examiner* — Robert J Michaud
(74) *Attorney, Agent, or Firm* — F. Chau & Associates, LLC

(57) ABSTRACT

A display device includes a display panel, and an input sensing part disposed on the display panel and in which an active region and a non-active region around the active region are defined. The input sensing part includes a plurality of sensing electrodes dispose in the active region, a plurality of sensing lines electrically connected to the sensing electrodes and disposed in the non-active region, and a guard line, a ground line, and an electromagnetic attenuating line spaced apart from the sensing lines and disposed in the non-active region. The guard line, the ground line, and the electromagnetic attenuating line are disposed at an outside of the sensing lines.

20 Claims, 25 Drawing Sheets

INPUT SENSING PART AND DISPLAY DEVICE INCLUDING THE SAME

CROSS-REFERENCE TO RELATED APPLICATIONS

This application claims priority under 35 U.S.C. § 119 to Korean Patent Application No. 10-2022-0038197 filed on Mar. 28, 2022, in the Korean Intellectual Property Office, the disclosure of which is incorporated by reference herein in its entirety.

TECHNICAL FIELD

Embodiments of the present disclosure described herein relate to an input sensing part and a display device including the same.

DISCUSSION OF THE RELATED ART

In general, an electronic device, such as a smart phone, a digital camera, a laptop computer, a navigation system, or a smart television, which provides an image to a user, includes a display device to display the image. The display device generates an image and then provides the generated image to the user through a display screen.

Many display devices are capable of sensing a touch input and such display devices include a display panel to generate the image and an input sensing part disposed on the display panel to sense an external input. The input sensing part is disposed on the display panel to sense the touch of a user, which serves as the external input. The input sensing part includes a plurality of sensing electrodes to sense the external input and a plurality of sensing lines electrically connected to the sensing electrodes. The sensing electrodes are disposed in an active region, and the sensing lines are disposed in a non-active region positioned at the peripheral portion of the active region.

A driving signal is applied to the sensing electrodes, and the change in the capacitance between the sensing electrodes is output in the form of a sensing signal. The driving signal is applied to the sensing electrodes through the sensing lines. When a driving signal having a specific frequency is applied to the sensing electrode, an unwanted electromagnetic wave resulting from the driving signal may be produced.

The electromagnetic wave may produce noise in another device and may disturb its operation. This phenomenon may be defined as an electromagnetic interference (EMI).

SUMMARY

A display device includes a display panel, and an input sensing part disposed on the display panel. The display panel includes an active region and a non-active region at least partially surrounding the active region. The input sensing pan further includes a plurality of sensing electrodes dispose within the active region. A plurality of sensing lines is electrically connected to the sensing electrodes and is disposed in the non-active region. A guard line, a ground line, and an electromagnetic attenuating line are each spaced apart from the sensing lines and are each disposed in the non-active region. The guard line, the ground line, and the electromagnetic attenuating line are each disposed at an outside of the sensing lines.

An input sensing part includes a plurality of sensing electrodes disposed in an active region, a plurality of sensing lines electrically connected to the sensing electrodes and disposed in a non-active region at least partially surrounding the active region, and a guard line, a ground line, and an electromagnetic attenuating line that are each spaced apart from the sensing lines and are each disposed in the non-active region. The electromagnetic attenuating line is disposed between the guard line and the ground line, and the guard line is closer to the sensing lines than is the electromagnetic attenuating line.

A display device includes a display panel including a substrate, an encapsulating substrate disposed on the substrate, a display device layer disposed between the substrate and the encapsulating substrate, and a sealing layer disposed between the substrate and the encapsulating substrate and sealing the display device layer, and an input sensing part. The input sensing part includes a plurality of sensing electrodes, a plurality of sensing lines electrically connected to the sensing electrodes, and a guard line, a ground line, and an electromagnetic attenuating line that are each spaced apart from the sensing lines. The guard line, the ground line, and the electromagnetic attenuating line may each overlap the sealing layer.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
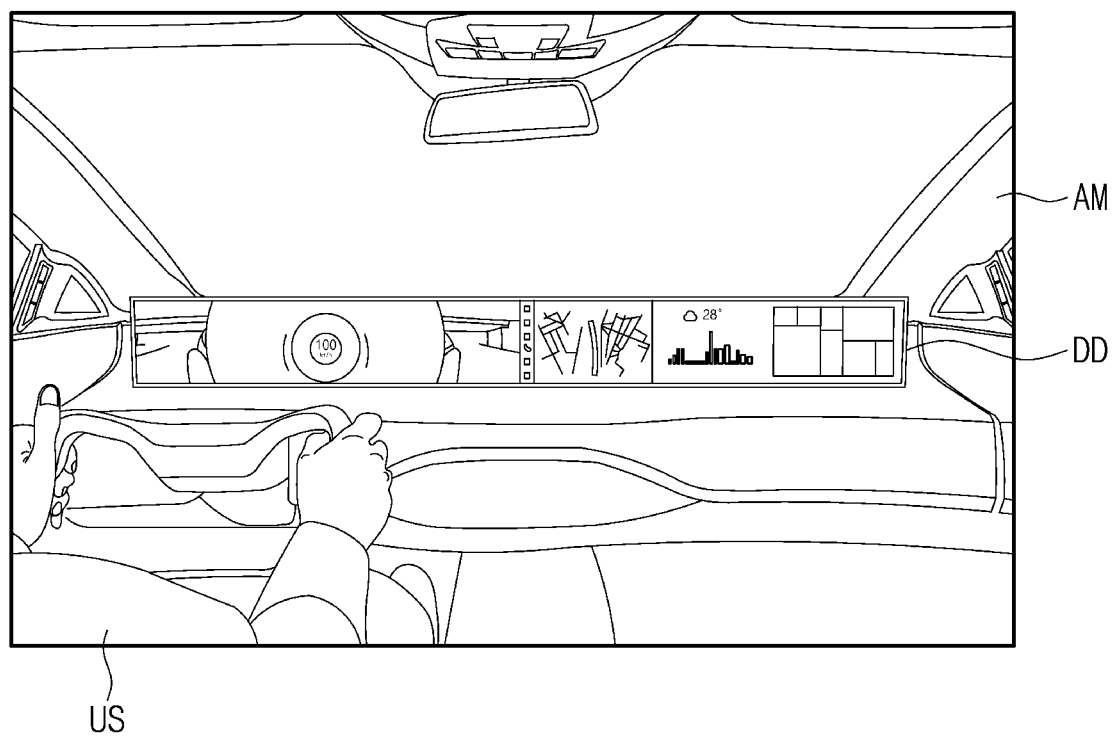
FIG. 1 is a view illustrating the interior of a vehicle having a display device, according to an embodiment of the present disclosure.

In the specification, when one component (or region, layer, part, or the like) is referred to as being "on", "connected to", or "coupled to" another component, it should be understood that the former may be directly on, connected to, or coupled to the latter, and also may be on, connected to, or coupled to the latter via a third intervening component.

The same reference numeral may refer to the same component throughout the specification and the drawings. In addition, in drawings, relative thicknesses, proportions, angles, and dimensions of components are intended to be drawing to scale at least with respect to an embodiment of the present disclosure, however, it is to be understood that modifications may be made to these values without departing from the spirit of the present disclosure.

The term "and/or" includes any and all combinations of one or more of associated components Although the terms "first", "second", etc. may be used to describe various components, the components should not be construed as necessarily being limited by the terms. The terms are only used to distinguish one component from another component. For example, without departing from the scope and spirit of the present disclosure, a first component may be referred to as a second component, and similarly, the second component may be referred to as the first component. The singular forms are intended to include the plural forms unless the context clearly indicates otherwise.

In addition, the terms "under", "at a lower portion", "above", "an upper portion" are used to describe the relationship between components illustrated in drawings. The terms are relative and are described with reference to a direction indicated in the drawing.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Hereinafter, an embodiment of the present disclosure will be described with reference to accompanying drawings.

Figure 2:
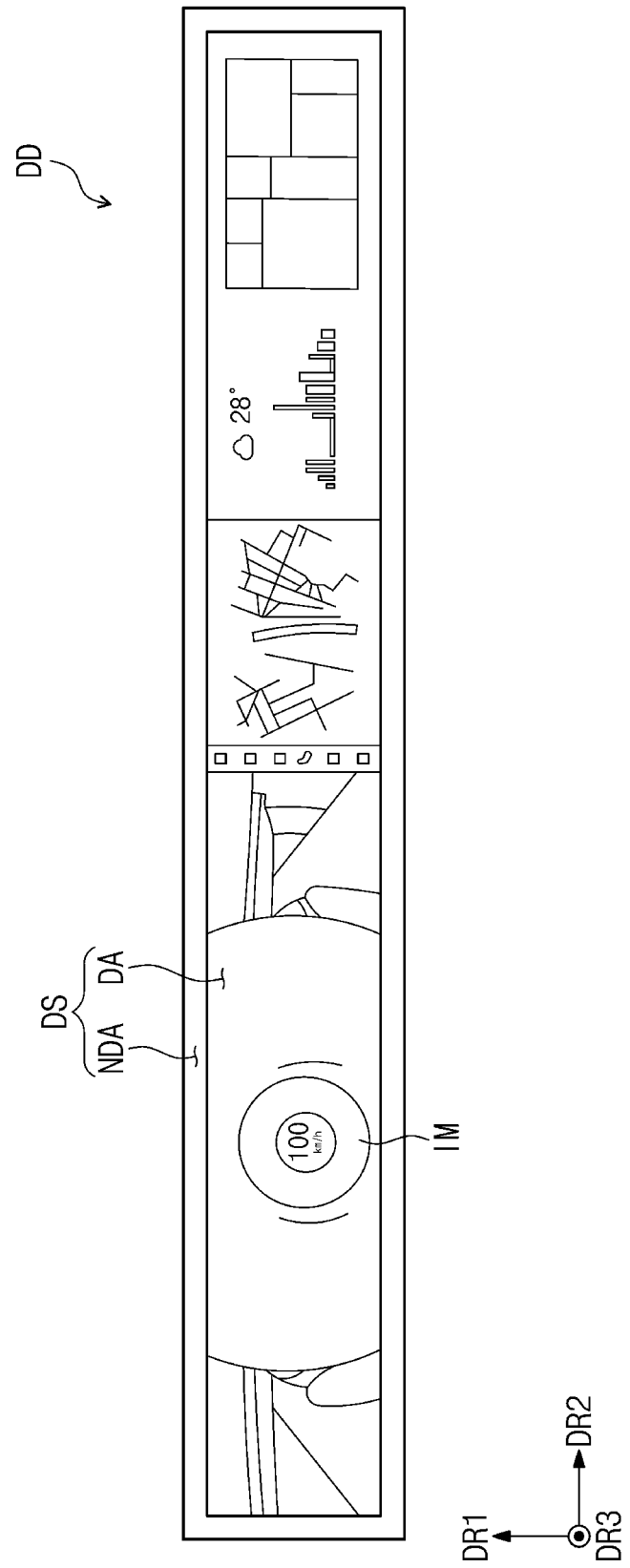
FIG. 2 is a plan view illustrating a display device illustrated in FIG. 1.

FIG. 1 is a view illustrating the interior of a vehicle having a display device, according to an embodiment of the present disclosure. FIG. 2 is a plan view illustrating a display device illustrated in FIG. 1.

Referring to FIG. 1, a display device DD may be disposed inside a vehicle AM. The display device DD is disposed inside the vehicle AM to display various information to a driver US (hereinafter, a user). The display device DD may display information, such as a speed, weather conditions/forecast, or a map, to the user US. The display device DD may be a touch display which operates in response to a touch input of the user US.

Referring to FIGS. 1 and 2, the display device DD, according to an embodiment of the present disclosure, may have a rectangle shape having a pair of shorter sides extending in a first direction DR1 and a pair of longer sides extending in a second direction DR2 crossing the first direction DR1. However, the present disclosure is not necessarily limited thereto, but the display device DD may have various shapes such as a circle or a polygon.

Hereinafter, a direction substantially perpendicular to a plane defined by the first direction DR1 and the second direction DR2 is defined as a third direction DR3. Furthermore, in the specification, the meaning of "when viewed in a plan view" may refer to "when viewed in the third direction DR3".

A top surface of the display device DD, which is used to provide an image to the user, may be defined as a display surface DS and may have the plane defined by the first direction DR1 and the second direction DR2. Images IM generated by the display device DD may be provided to the user US through the display surface DS. The display device DD may sense the touch of the user US.

The display surface DS may include a display region DA and a non-display region NDA positioned at a peripheral portion of the display region DA. For example, the non-display region NDA may at least partially surround the display region DA. The display region DA displays an image, but the image is not displayed in the non-display region NDA. The non-display region NDA may be defined as an edge of the display device DD, which surrounds the display region DA. The non-display region NDA may be printed in a specific color, such as black.

For example, although the display device DD for the vehicle is illustrated, the present disclosure is not necessarily limited thereto. For example, according to an embodiment of the present disclosure, the display device DD may be applied to an electronic device, such as a smartphone, a digital camera, a laptop computer, a computer monitor, and/or a smart television, to display an image to the user.

Figure 3:
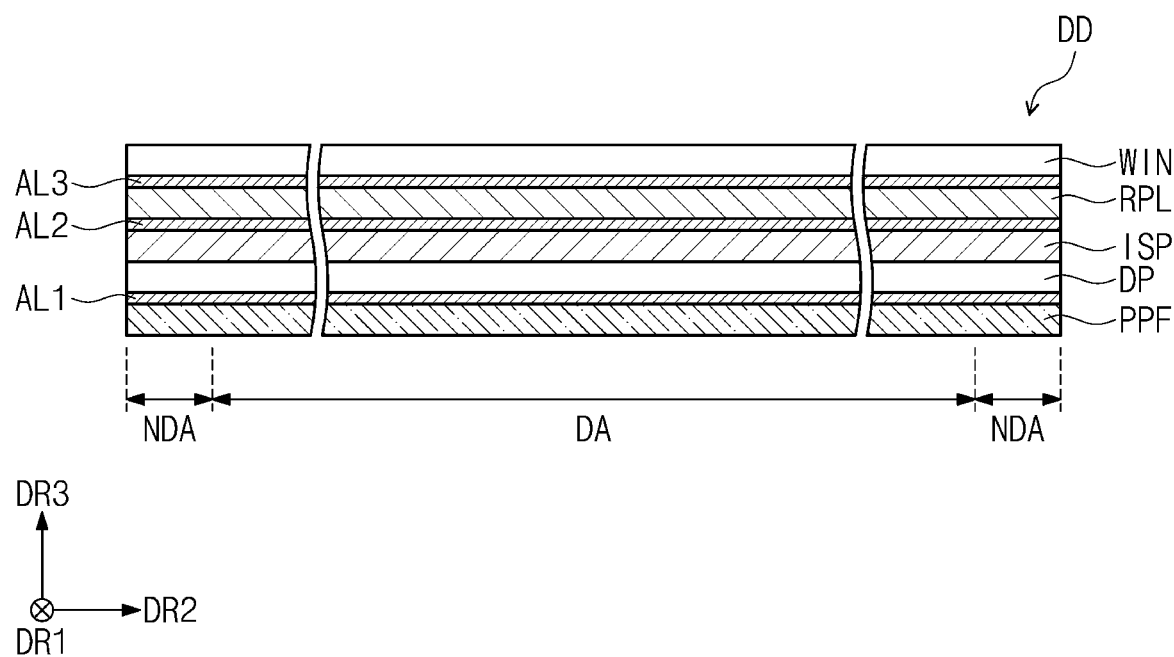
FIG. 3 is a cross-sectional view illustrating the display device illustrated in FIG. 2.

FIG. 3 is a cross-sectional view illustrating the display device illustrated in FIG. 2.

For example, FIG. 3 illustrates a cross-sectional view of the display device DD, when viewed in the first direction DR1.

Referring to FIG. 3, the display device DD may include a display panel DP, an input sensing part ISP, an anti-reflective layer RPL, a window WIN, a panel protective film PPF, and first to third adhesive layers AL1 to AL3.

The display panel DP may be a flexible display panel which can be bent to a noticeable degree without cracking or sustaining other damage. The display panel DP, according to an embodiment of the present disclosure, may be a light emitting display panel, but is not necessarily particularly limited thereto. For example, the display panel DP may be an organic light emitting display panel or an inorganic light emitting display panel. A light emitting layer of the organic light emitting display layer may include an organic light emitting material. The light emitting layer of the inorganic light emitting display panel may include a quantum dot, or a quantum rod. Hereinafter, the display panel DP is an organic light emitting display panel.

The input sensing part ISP may be disposed directly on the display panel DP. The input sensing part ISP may include a plurality of sensing parts for sensing an external input in a capacitive manner. The input sensing part ISP may be directly formed on the display panel DP when manufacturing the display device DD. However, the present disclosure is not necessarily limited thereto. The input sensing part ISP may be manufactured separately from the display panel DP, and may be attached to the display panel DP by the adhesive layer The anti-reflective layer RPL may be disposed on the input sensing part ISP. The anti-reflective layer RPL may be defined as a film to prevent external light from being reflected. The anti-reflective layer RPL may reduce the reflectance of external light incident from the top surface of the display device DD toward the display panel DP.

When the external light toward the display panel DP is reflected from the display panel DP and provided again to an external user, the user may be able to perceive the external light, which has a mirror-like effect. To prevent the above phenomenon, the anti-reflective layer RPL may include a plurality of color filters to display the same color as that of the pixels of the display panel DP.

The color filters may filter the external light in the same color as that of the pixels. In this case, the external light might not be viewed by the user. However, the present disclosure is not necessarily limited thereto. For example, the anti-reflective layer RPL may include a phase retarder and/or a polarizer, to reduce the reflective index of the external light.

The window WIN may be disposed on the anti-reflective layer RPL. The window WIN may protect the display panel DP, the input sensing part ISP, and the anti-reflective layer RPL from external scratches and impacts.

The panel protective film PPF may be disposed under the display panel DP. The panel protective film PPF may protect a bottom surface of the display panel DP. The panel protective film PPF may include a flexible plastic material such as polyethyleneterephthalate (PET).

The first adhesive layer AL1 may be disposed between the display panel DP and the panel protective film PPF. The display panel DP and the panel protective film PPF may adhere to each other through the first adhesive layer AL1.

The second adhesive layer AL2 may be disposed between the anti-reflective layer RPL and the input sensing part ISP. The anti-reflective layer RPL and the input sensing part ISP may adhere to each other through the second adhesive layer AL2.

The third adhesive layer AL3 may be disposed between the window WIN and the anti-reflective layer RPL. The window WIN and the anti-reflective layer RPL may adhere to each other through the third adhesive layer AL3.

Figure 4:
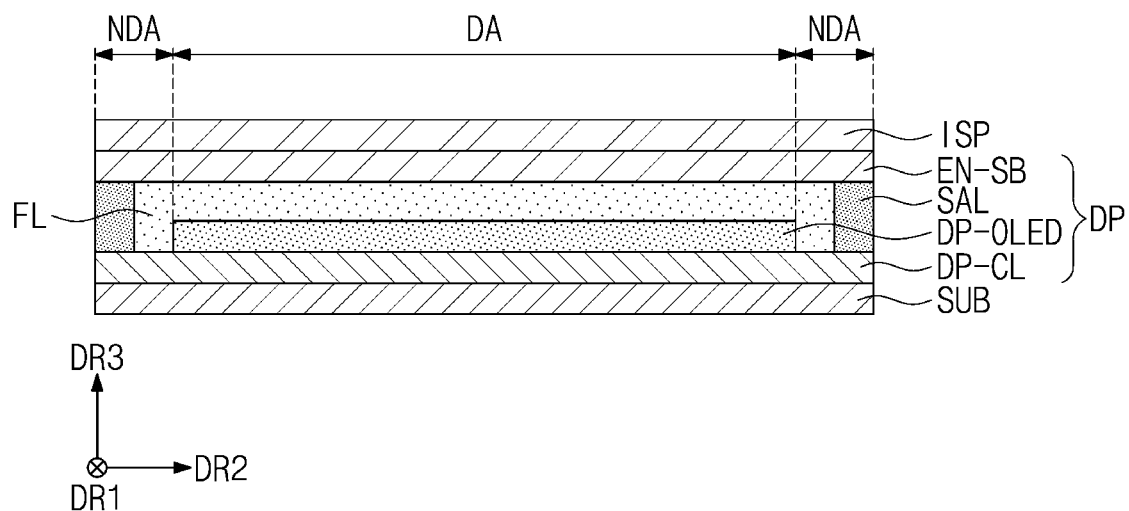
FIG. 4 is across-sectional view illustrating the display panel illustrated in FIG. 3.

FIG. 4 is a cross-sectional view illustrating the display panel illustrated in FIG. 3.

FIG. 4 is a cross-sectional view illustrating the display panel DP when viewed in the first direction DR1, in which the input sensing part ISP is illustrated together with the display panel DP.

Referring to FIG. 4, the display panel DP may include a substrate SUB, a circuit device layer DP-CL, a display device layer DP-OLED, an encapsulating substrate EN-SB, a sealing layer SAL, and a filler FL. The circuit device layer DP-CL may be disposed on the substrate SUB. The display device layer DP-OLED is disposed on the circuit device layer DP-CL.

A plurality of pixels may be disposed in the circuit device layer DP-CL and the display device layer DP-OLED. Each of the pixels may include a transistor disposed in the circuit device layer DP-CL and a light emitting device disposed in the display device layer DP-OLED to be electrically connected to the transistor.

The substrate SUB may include the display region DA and the non-display region NDA positioned at the peripheral portion of the display region DA. The display device layer DP-OLED is disposed in the display region DA. The encapsulating substrate EN-SB may be disposed on the display device layer DP-OLED. The substrate SUB and the encapsulating substrate EN-SB may each be rigid.

The sealing layer SAL may be disposed between the substrate SUB and the encapsulating substrate EN-SB. The sealing layer SAL may be disposed in the non-display region NDA. The sealing layer SAL may allow the substrate SUB and the encapsulating substrate EN-SB to adhere to each other. The display device layer DP-OLED may be sealed between the substrate SUB and the encapsulating substrate EN-SB through the sealing layer SAL. The sealing layer SAL may include a photo-curable material.

The filler FL may be disposed between the substrate SUB and the encapsulating substrate EN-SB. The filler FL may be disposed in a space between the substrate SUB and the encapsulating substrate EN-SB and sealed by the sealing layer SAL. The filler FL may include a photo-curable material.

The input sensing part ISP may be disposed directly on the display panel DP. For example, the input sensing part ISP may be disposed directly on the encapsulating substrate EN-SB.

Figure 5:
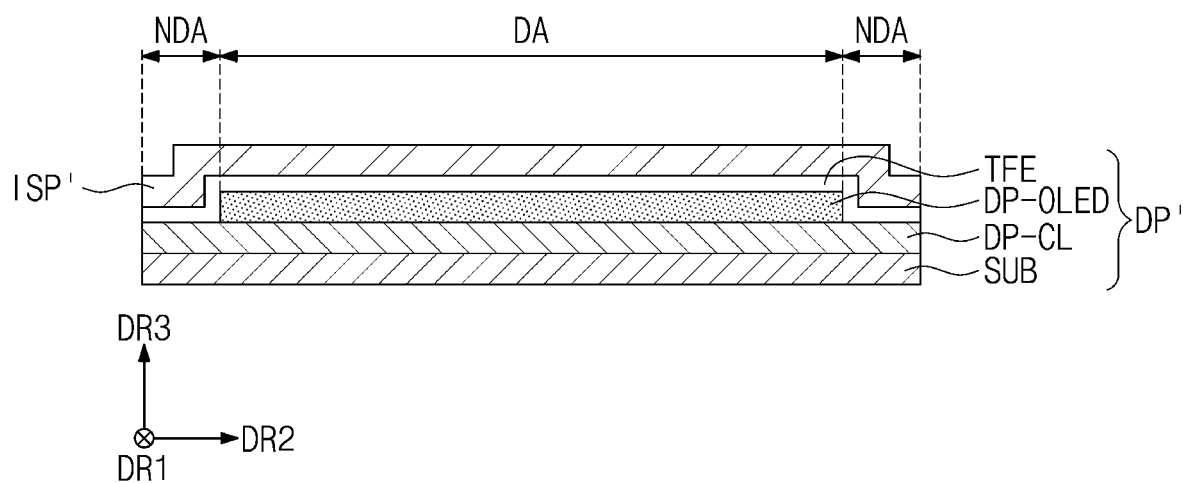
FIG. 5 is a cross-sectional view illustrating a display panel, according to an embodiment of the present disclosure.

FIG. 5 is a cross-sectional view illustrating a display panel, according to an embodiment of the present disclosure.

For example, FIG. 5 illustrates an input sensing part ISP' and a display panel DP' together.

Referring to FIG. 5, the display panel DP' may include the substrate SUB, the circuit device layer DP-CL disposed on the substrate SUB, the display device layer DP-OLED disposed on the circuit device layer DP-CL, and a thin film encapsulating layer TFE disposed on the display device layer DP-OLED. The arrangement structure of the circuit device layer DP-CL and the display device layer DP-OLED may be the same as that of the circuit device layer DP-CL and the display device layer DP-OLED illustrated in FIG. 4.

The thin film encapsulating layer TFE may be disposed on the circuit device layer DP-CL and may cover the display device layer DP-OLED. The thin film encapsulating layer TFE may include inorganic layers and an organic layer between the inorganic layers. The inorganic layers may protect the pixels from moisture/oxygen. The organic layer may protect the pixels from foreign substances such as dust particles.

The input sensing part ISP' may be disposed directly on the display panel DP'. For example, the input sensing part ISP' may be disposed directly on the thin film encapsulating layer TFE.

Figure 6:
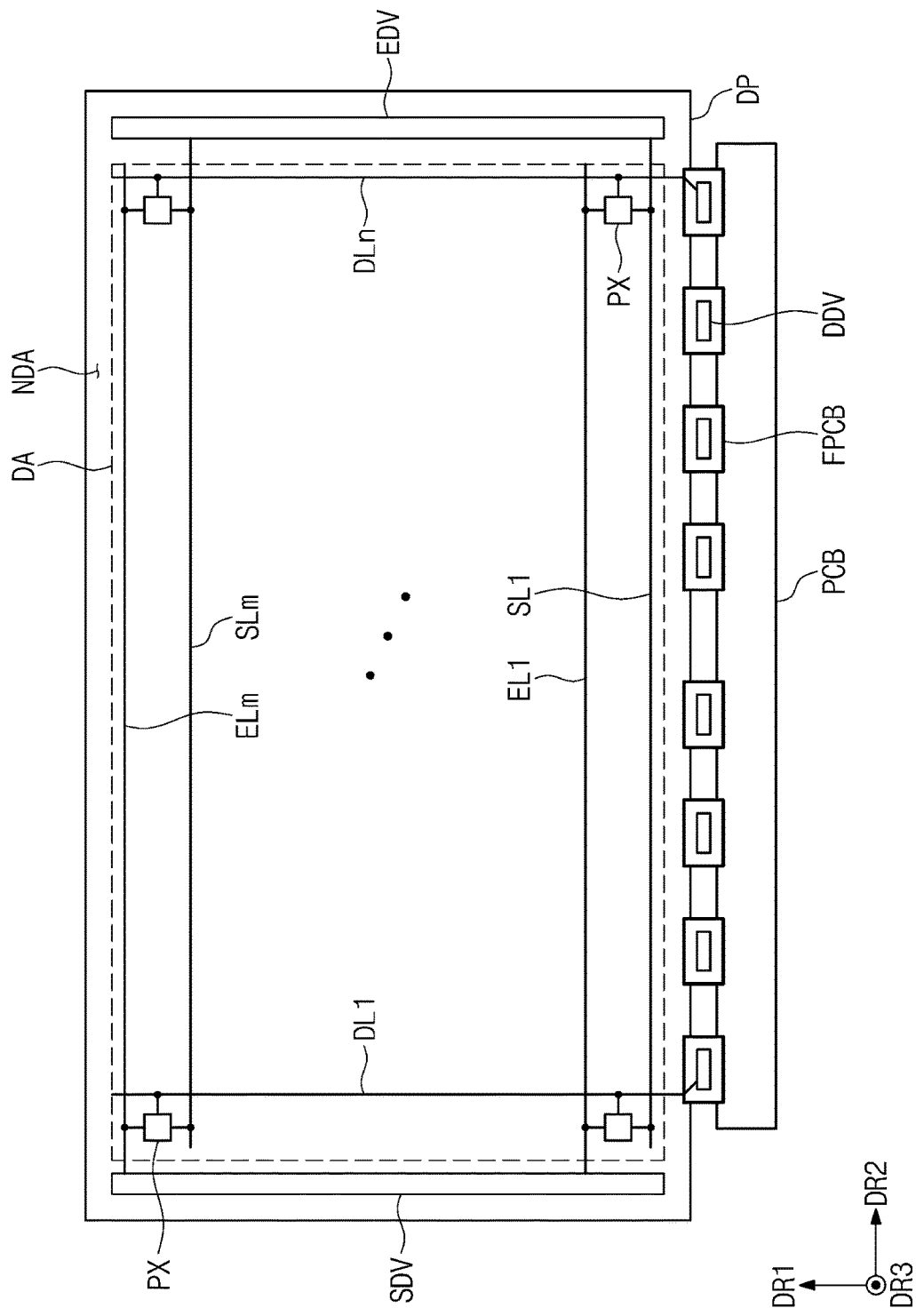
FIG. 6 is a plan view of a display panel shown in FIG. 3.

FIG. 6 is a plan view illustrating a display panel illustrated in FIG. 3.

Referring to FIG. 6, the display device DD may include the display panel DP, a scan driver SDV, a plurality of data drivers DDV, a plurality of flexible printed circuit substrates FPCB, an emission driver EDV, and a printed circuit board PCB.

The display panel DP may include the display region DA and the non-display region NDA surrounding the display region DA. The display region DA and the non-display region NDA of the display panel DP may correspond to the display region DA and the non-display region NDA illustrated in FIG. 2, respectively. Although the display panel DP may have the shape of a rectangle having a pair of longer side extending in the second direction DR2 and a pair of shorter side extending in the first direction DR1, the shape of the display panel DP is not necessarily limited thereto.

The display panel DP may include a plurality of pixels PX, a plurality of scan lines SL1 to SLm, a plurality of data lines DL1 to DLn, and a plurality of light emitting lines EL1 to Elm. In this case, 'm' and 'n' are positive integers.

The pixels PX may be disposed in the display region DA. The scan driver SDV and the emission driver EDV may be disposed in the non-display region NDA which are adjacent to the shorter sides of the display panel DP, respectively.

The data drivers DDV may be adjacent to a lower portion of the display panel DP, which is defined as one of the pair of longer sides of the display panel DP, when viewed in a plan view. The printed circuit board PCB may be adjacent to the lower portion of the display panel DP, when viewed in a plan view. The flexible printed circuit boards FPCB may be connected to the lower portion of the display panel DP and the printed circuit board PCB. The data drivers DDV may be manufactured in the form of an integrated chip and may be mounted on the flexible printed board FPCB.

The scan lines SL1 to SLm may extend in the second direction DR2 to be electrically connected to the pixels PX and the scan driver SDV. The light emitting lines EL1 to ELm may extend in the second direction DR2 and be electrically connected to the pixels PX and the emission driver EDV.

The data lines DL1 to DLm may extend in the first direction DR1 and be electrically connected to the pixels PX and the data driver DDV. Although two data lines DL1 and DLn electrically connected to data drivers DDV disposed at the left most side and the right most side are illustrated, a plurality of data lines may be electrically connected to the data drivers DDV, respectively.

The display device DD may further include a timing controller to control operations of the scan driver SDV, the data driver DDV, and the emission driver EDV. The timing controller, which may be manufactured in the form of an integrated circuit chip, may be mounted on the printed circuit board PCB. The timing controller may be electrically connected to the data drivers DDV, the scan driver SDV, and the emission driver EDV through the printed circuit board PCB and the flexible printed circuit board FPCB.

The scan driver SDV generates a plurality of scan signals, and the scan signals may be applied to the pixels PX through scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the light emitting lines EL1 to ELm.

The pixels PX may receive data voltages in response to the scan signals. The pixels PX may display the image, as the pixels PX emit light having luminance corresponding to the data voltages, in response to the emission signals. The time to emit light by the pixels PX may be controlled through the emission signals.

Figure 7:
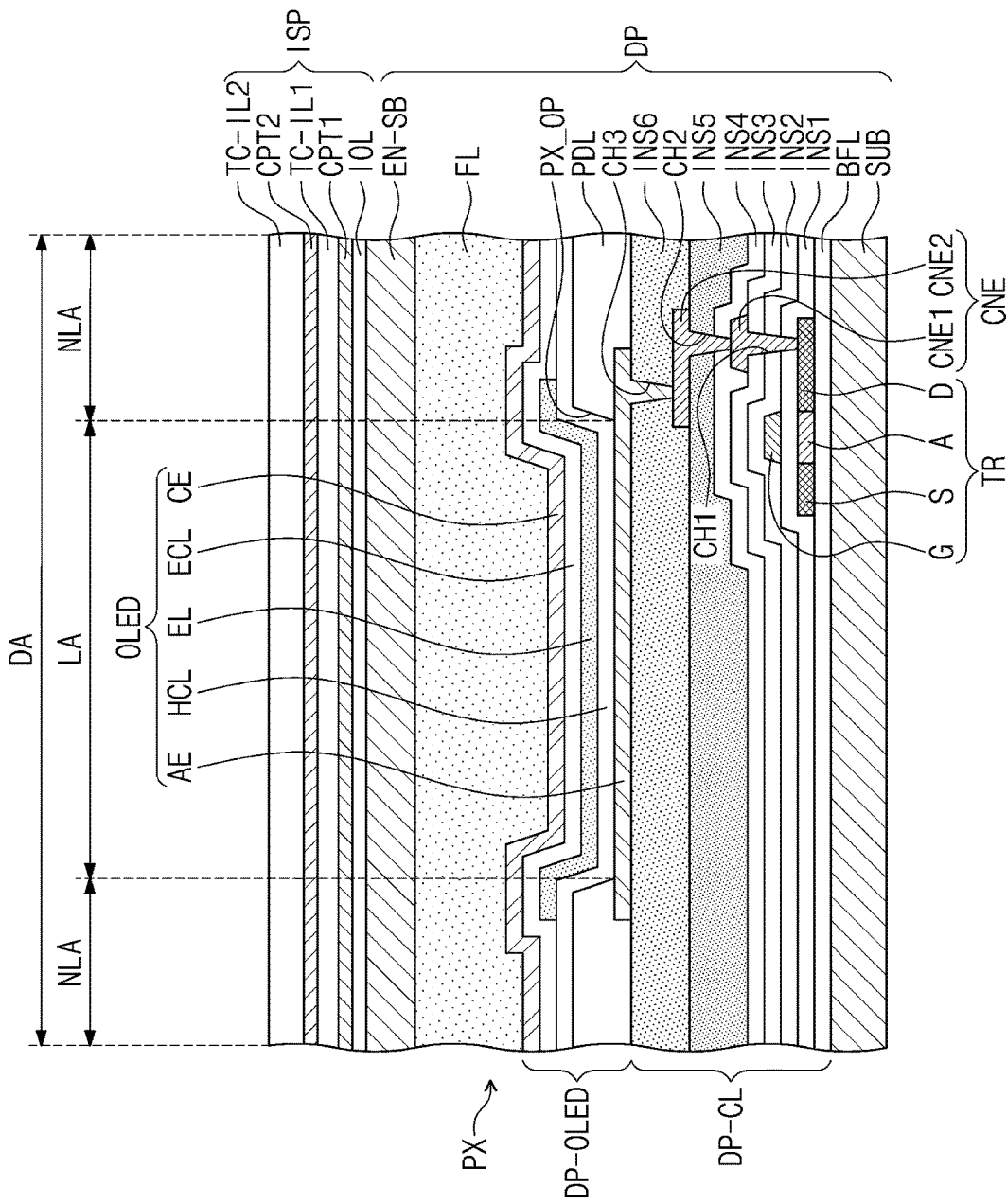
FIG. 7 is a cross-sectional view illustrating a pixel and an input sensing part of the display panel of FIG. 4.

FIG. 7 is a cross-sectional view illustrating a pixel and an input sensing part of a display panel of FIG. 4.

The pixel PX illustrated in FIG. 7 may be one of the pixels PX illustrated in FIG. 6.

Referring to FIG. 7, the pixel PX may include a transistor TR and a light emitting device OLED. The light emitting device OLED may include a first electrode AE (or an anode), a second electrode CE (or a cathode), a hole control layer HCL, an electron control layer ECL, and a light emitting layer EL.

The transistor TR and the light emitting device OLED may be disposed on the substrate SUB. For example, although one transistor TR is illustrated, the pixel PX may include a plurality of transistors to drive the light emitting device OLED and at least one capacitor.

The display region DA may include a light emitting region LA and a non-light emitting region NLA positioned at a peripheral portion of the light emitting region LA, which correspond to each pixel PX. The light emitting device OLED may be disposed in the light emitting region LA.

A buffer layer BFL may be disposed on the substrate SUB. The buffer layer BFL may be an inorganic layer. A semiconductor pattern may be disposed on the buffer layer BFL. The semiconductor pattern may include polysilicon, amorphous silicon, or metal oxide.

The semiconductor pattern may be doped with an N-type dopant or a P-type dopant. The semiconductor pattern may include a heavily doped region and a lightly doped region. Conductivity of the heavily doped region may be greater than that of the lightly doped region. The heavily doped region may substantially serve as a source electrode and a drain electrode of the transistor TR. The lightly doped region may correspond to an active region (or channel) of the transistor.

A source 'S', an active 'A', and a drain 'D' of the transistor TR may be formed from the semiconductor pattern. A first insulating layer INS1 may be disposed on the semiconductor pattern. The gate 'G' of the transistor TR may be disposed on the first insulating layer INS1. A second insulating layer INS2 may be disposed on the gate 'G'. A third insulating layer INS3 may be disposed on the second insulating layer INS2.

A connection electrode CNE may include a first connection electrode CNE1 and a second connection electrode CNE2 to connect the transistor TR to the light emitting device OLED. The first connection electrode CNE1 may be disposed on the third insulating layer INS3 and may be electrically connected to the drain 'D' through a first contact hole CH1 defined in the first to third insulating layers INS1 to INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be electrically connected to the first connection electrode CNE1 through a second contact hole CH2 defined in the fourth and fifth insulating layers INS4 and INS5.

A sixth insulating layer INS6 may be disposed on the second connection electrode CNE2. Layers ranging from the buffer layer BFL to the sixth insulating layer INS6 may be defined as the circuit device layer DP-CL. The first to sixth insulating layers INS1 to INS6 may be inorganic layers or organic layers.

The first electrode AE may be disposed on the sixth insulating layer INS6. The first electrode AE may be electrically connected to the second connection electrode CNE2 through a third contact hole CH3 defined in the sixth insulating layer INS6. A pixel defining layer PDL may be disposed on the first electrode AE and the sixth insulating layer INS6 to define an opening PX_OP, such that a specific portion of the first electrode AE is exposed.

The hole control layer HCL may be disposed on the first electrode AE and the pixel defining layer PDL. The hole control layer HCL may include a hole transport layer and a hole injection layer.

The light emitting layer EL may be disposed on the hole control layer HCL. The light emitting layer EL may be disposed in a region corresponding to the opening PX_OP. The light emitting layer EL may include an organic material and/or an inorganic material. The light emitting layer EL may generate any one of red light, green light, and blue light.

The electron control layer ECL may be disposed on the light emitting layer EL and the hole control layer HCL. The electron control layer ECL may include an electron transport layer and an electron injection layer. The hole control layer HCL and the electron control layer ECL may be disposed in common in the light emitting region LA and the non-light emitting region NLA.

The second electrode CE may be disposed on the electron control layer ECL. The second electrode CE may be disposed in the pixels PX in common. For example, the second electrode CE may be disposed in the form of one electrode throughout the entire portion of the display region DA. The layer, in which the light emitting device OLED is disposed, may be defined as the display device layer DP-OLED.

A first voltage may be applied to the first electrode AE through the transistor TR, and a second voltage may be applied to the second electrode CE. An exciton may be formed, as a hole and an electron injected into the light emitting layer EL are combined with each other. As the exciton relaxes to be in a ground state, the light emitting device OLED may emit light.

The filler FL may be disposed on the second electrode CE and may cover the pixel PX. The encapsulating substrate EN-SB may be disposed on the filler FL. The input sensing part ISP may be disposed on the encapsulating substrate EN-SB.

An insulating layer IOL may be disposed on the encapsulating substrate EN-SB. The insulating layer IOL may include an inorganic insulating layer. At least one insulating layer IOL may be provided on the encapsulating substrate EN-SB. For example, two inorganic insulating layers IOL may be sequentially laminated on the encapsulating substrate EN-SB.

The input sensing part ISP may include a first conductive layer CPT1 and a second conductive layer CPT2. The first and second conductive layers CPT1 and CPT2 may include transparent conductive materials. The first and second conductive layers CPT1 and CPT2 may include transparent conductive oxide, such as indium tin oxide (ITO), indium zinc oxide (IZO), zinc oxide (ZnO), or indium zinc tin oxide (IZTO).

The first conductive layer CPT1 may be disposed on the insulating layer IOL. A first insulating layer TC-IL1 may be disposed on the first conductive layer CPT1. The first insulating layer TC-IL may be disposed on the insulating layer IOL and may cover the first conductive layer CPT1. The first insulating layer TC-IL1 may include an inorganic insulating layer or an organic insulating layer.

The second conductive layer CPT2 may be disposed on the first insulating layer TC-IL1. Sensing electrodes of the input sensing part ISP may be formed using the first and second conductive layers CPT1 and CPT2. The configuration will be described in detail below. When viewed in a plan view, the first and second conductive layers CPT1 and CPT2 may overlap the light emitting region LA. The light emitted from the light emitting device OLED may travel upward while being transmitted through the first and second conductive layers CPT1 and CPT2.

A second insulating layer TC-IL2 may be disposed on the second conductive layer CPT2. The second insulating layer TC-IL2 may be disposed on the first insulating layer TC-IL1 and may cover the second conductive layer CPT2. The second insulating layer TC-IL2 may include an organic insulating layer.

When the pixel PX is driven, signals applied to lines electrically connected to the transistor TR may exert an influence on signals applied to the first and second conductive layers CPT1 and CPT2. Noise may be produced in the input sensing part ISP due to the signal interference. However, according to an embodiment of the present disclosure, the second electrode CE receiving the common voltage may be disposed throughout the entire portion of the display region DA to block the signal interference. Accordingly, the noise of the input sensing part ISP may be reduced.

Figure 8:
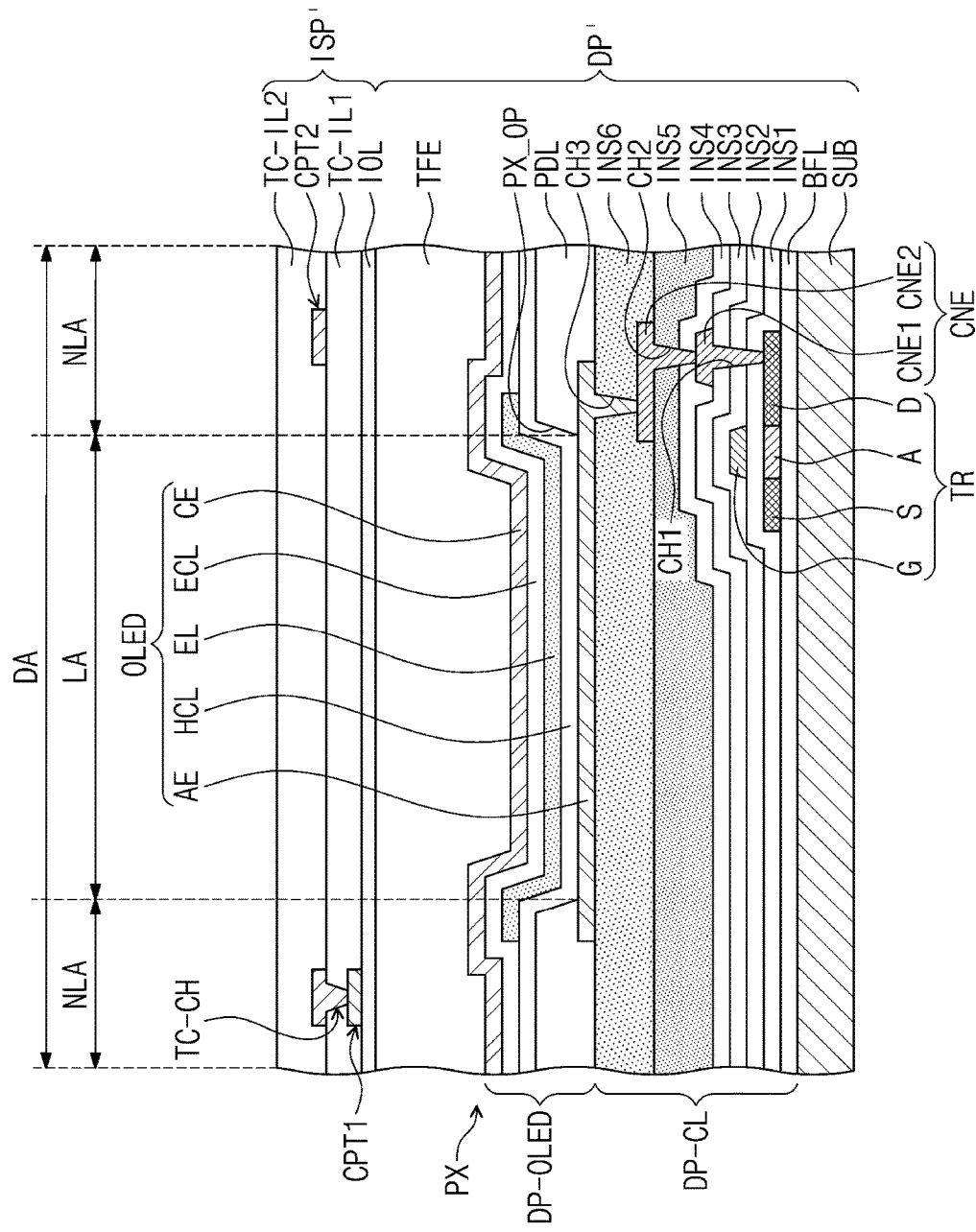
FIG. 8 is a cross-sectional view illustrating a pixel and an input sensing part, according to an embodiment of the present disclosure.

FIG. 8 is a cross-sectional view illustrating a pixel and an input sensing part, according to an embodiment of the present disclosure.

The pixel PX illustrated in FIG. 8 may be one of the pixels PX of the display panel DP' illustrated in FIG. 5. The configuration of the pixel PX illustrated in FIG. 8 may be the same as the configuration of the pixel PX illustrated in FIG. 7. Hereinafter, the input sensing part ISP' illustrated in FIG. 8 will be described while focusing on the difference from the input sensing part ISP illustrated in FIG. 7.

Referring to FIG. 8, the insulating layer IOL may be disposed on the thin film encapsulating layer TFE. The input sensing part ISP' may include the first conductive layer CPT1 and the second conductive layer CPT2. The first conductive layer CPT1 may be disposed on the insulating layer IOL. When viewed in a plan view, the first conductive layer CPT1 may overlap the non-light emitting region NLA instead of the light emitting region LA. The first insulating layer TC-IL1 may be disposed on the insulating layer IOL and may cover the first conductive layer CPT1.

The second conductive layer CPT2 may be disposed on the first insulating layer TC-IL1. When viewed in a plan view, the second conductive layer CPT2 may overlap the non-light emitting region NLA, instead of the light emitting region LA. A portion of the second conductive layer CPT2 may be electrically connected to the first conductive layer CPT1 through a contact hole TC-CH defined in the first insulating layer TC-IL1. Sensing electrodes of the input sensing part ISP' may be formed using the first and second conductive layers CPT1 and CPT2. The configuration will be described in detail below. The second insulating layer TC-IL2 may be disposed on the first insulating layer TC-IL1 and may cover the second conductive layer CPT2.

The first and second conductive layers CPT1 and CPT2 may include metal materials. For example, the first and second conductive layers CPT1 and CPT2 may include molybdenum (Mo), silver (Ag), titanium (Ti), copper (Cu), aluminum (Mo), or an alloy thereof. Since the first and second conductive layers CPT1 and CPT2, which reflect light, are not disposed in the light emitting region LA, the light emitted from the light emitting device OLED may travel upward through the light emitting region LA. The first and second conductive layers CPT1 and CPT2 may have a mesh or screen shape, and the configuration will be described in detail below.

Figure 9:
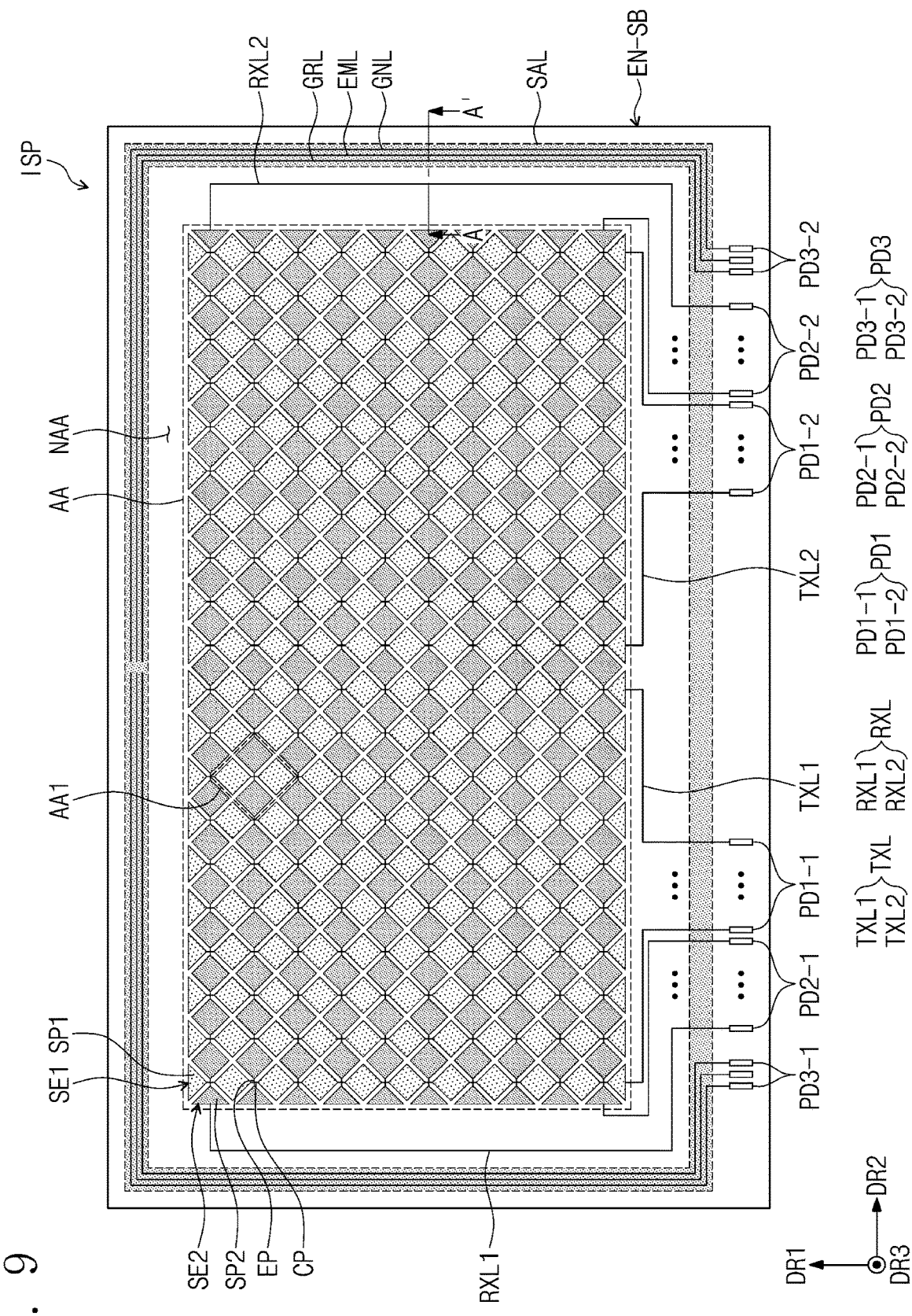
FIG. 9 is a plan view illustrating the input sensing part illustrated in FIG. 3.

FIG. 9 is a plan view illustrating the input sensing part illustrated in FIG. 3.

Referring to FIG. 9, the input sensing part ISP may include a plurality of sensing electrodes SE1 and SE2, a plurality of sensing lines TXL and RXL, a guard line GRL, a ground line GNL, an electromagnetic attenuating line EML, a plurality of first pads PD1, a plurality of second pads PD2, and a plurality of third pads PD3.

The sensing electrodes SE1 and SE2, the sensing lines TXL and RXL, the guard line GRL, the ground line GNL, the electromagnetic attenuating line EML, and the first, second, and third pads PD1, PD2, and PD3 may be disposed on the encapsulating substrate EN-SB.

When viewed in a plan view, the plane region of the input sensing part ISP may include an active region AA and a non-active region NAA positioned at a peripheral portion of the active region AA. The non-active region NAA may at least partially surround the active region AA. When viewed in a plan view, the active region AA may overlap the display region DA, and the non-active region NAA may overlap the non-display region NDA.

The sensing electrodes SE1 and SE2 may be disposed in the active region AA. The first, second, and third pads PD1, PD2, and PD3 may be disposed in the non-active region NAA. The first, second, and third pads PD1, PD2, and PD3 may be disposed in the non-active region NAA (hereinafter, referred to as a lower non-active region) adjacent to a lower side of the active region AA, when viewed in a plan view. The first, second, and third pads PD1, PD2, and PD3 may be divided and disposed at the left and right sides, based on the center of the lower non-active region NAA.

The first pads PD1 may include a plurality of (1-1)-th pads PD1-1 and a plurality of (1-2)-th pads PD1-2. The second pads PD2 may include a plurality of (2-1)-th pads PD2-1 and a plurality of (2-2)-th pads PD2-2. The third pads PD3 may include a plurality of (3-1)-th pads PD3-1 and a plurality of (3-2)-th pads PD3-2.

The (1-1)-th pads PD1-1, the (2-1)-th pads PD2-1, and the (3-1)-th pads PD3-1 may be disposed at the left side, based on the center of the lower non-active region NAA. The (1-2)-th pads PD1-2, the (2-2)-th pads PD2-2, and the (3-2)-th pads PD3-2 may be disposed at the right side based on the center of the lower non-active region NAA.

Based on the second direction DR2, in the lower non-active region NAA, the (2-1)-th pads PD2-1 may be disposed at an outside of the (1-1)-th pads PD1-1, and the (3-1)-th pads PD3-1 may be disposed at an outside of the (2-1)-th pads PD2-1. Accordingly, the (2-1)-th pads PD2-4 may be disposed between the (1-1)-th pads PD1-1 and the (3-1)-th pads PD3-1.

Based on the second direction DR2, in the lower non-active region NAA, the (2-2)-th pads PD2-2 may be disposed at an outside of the (1-2)-th pads PD1-2, and the (3-2)-th pads PD3-2 may be disposed at an outside of the (2-2)-th pads PD2-2. Accordingly, the (2-2)-th pads PD2-2 may be disposed between the (1-2)-th pads PD1-2 and the (3-2)-th pads PD3-2.

The sensing lines TXL and RXL may be electrically connected to the sensing electrodes SE1 and SE2, and may extend to the non-active region NAA and may be electrically connected to the first and second pads PD1 and PD2. A sensing controller to control the input sensing part ISP may be electrically connected to the first and second pads PD1 and PD2.

The sensing electrodes SE1 and SE2 may include a plurality of first sensing electrodes SE1 extending in the first direction DR1 and arranged in the second direction DR2, and a plurality of second sensing electrodes SE2 extending in the second direction DR2 and arranged in the first direction DR1. The second sensing electrodes SE2 may cross the first sensing electrodes SE1 while being insulated from the first sensing electrodes SE1.

The sensing lines TXL and RXL may include a plurality of first sensing lines TXL electrically connected to the first sensing electrodes SE1 and a plurality of second sensing lines RXL electrically connected to the second sensing electrodes SE2. The first sensing lines TXL may be electrically connected to first ends of the first sensing electrodes SE1. The first ends of the first sensing electrodes SE1 may be adjacent to the lower non-active region NAA. The second sensing lines RXL may be electrically connected to opposite ends of the second sensing electrodes SE2. The opposite ends of the second sensing electrodes SE2 may be opposite to each other in the second direction DR2.

The first sensing lines TXL may extend to the non-active region NAA and may be electrically connected to the first pads PD1. The first sensing lines TXL may extend to the lower non-active region NAA.

The second sensing lines RXL may extend to the non-active region NAA and may be electrically connected to the second pads PD2. The second sensing lines RXL may extend to the non-active regions NAA adjacent to opposite sides of the active region AA opposite to each other in the second direction DR2 and the lower non-active region NAA.

The first sensing lines TXL may include a plurality of first transmission lines TXL1 and a plurality of second transmission lines TXL2. The first transmission lines TXL1 may be electrically connected to some first sensing electrodes SE1 and the (1-1)-th pads PD1-1. For example, the first transmission lines TXL1 may be electrically connected to first ends of the first sensing electrodes SE1 disposed at the left side of the center of the active region AA.

The second transmission lines TXL2 may be electrically connected to other first sensing electrodes SE1 and the (1-2)-th pads PD1-2. For example, the second transmission lines TXL2 may be electrically connected to first ends of the first sensing electrodes SE1 disposed at the right side of the center of the active region AA.

The second sensing lines RXL may include a plurality of first receiving lines RXL1 and a plurality of second receiving lines RXL2. The first receiving lines RXL1 may be electrically connected to first ends of the second sensing electrodes SE2 and the (2-1)-th pads PD2-1. For example, when viewed in a plan view, the first receiving lines RXL1 may be disposed in the non-active region NAA (hereinafter, referred to as a left non-active region) adjacent to the left side of the active region AA and first ends of the second sensing electrodes SE2 may be adjacent to the left non-active region NAA.

The second receiving lines RXL2 may be electrically connected to opposite ends of the second sensing electrodes SE2 and the (2-2)-th pads PD2-2. For example, when viewed in a plan view, the second receiving lines RXL2 may be disposed in the non-active region NAA (hereinafter, referred to as a right non-active region) adjacent to the right side of the active region AA and opposite ends of the second sensing electrodes SE2 may be adjacent to the right non-active region NAA.

A driving signal may be applied to the first sensing electrodes SE1 through the first sensing lines TXL. The change in the capacitance formed between the first and second sensing electrodes SE1 and SE2 may be output in the form of a sensing signal through the second sensing lines RXL.

The first sensing electrodes SE1 may include a plurality of first sensing parts SP1 arranged in the first direction DR1 and a plurality of connection patterns CP connecting the first sensing parts SP1 to each other.

Each connection pattern CP may be disposed between two first sensing parts SP1, which are adjacent to each other in the first direction DR1, to connect the two first sensing parts SP1 to each other. For example, an insulating layer may be disposed between the connection patterns CP and the first sensing parts SP1, and the connection patterns CP may be electrically connected to the first sensing parts SP1 through contact holes defined in the insulating layer. The configuration will be described in detail with reference to FIGS. 10 and 11.

The second sensing electrodes SE2 may include a plurality of second sensing parts SP2 arranged in the second direction DR2 and a plurality of extending patterns EP extending from the second sensing parts SP2 to each other. In each second sensing electrode SE2, the extending patterns EP may be formed integrally with the second sensing parts SP2. Each extending pattern EP may be disposed between two second sensing parts SP2, which are adjacent to each other in the second direction DR2, and may extend from the two second sensing parts SP2 to each other.

The configuration will be described in detail with reference to FIGS. 10 and 11. When viewed in a plan view, the extending patterns EP may extend to cross the connection patterns CP.

The first sensing parts SP1 and the second sensing parts SP2 may be spaced apart from each other without overlapping with each other, and may be alternately arranged. The capacitance may be formed by the first sensing parts SP1 and the second sensing parts SP2.

The first and second sensing pans SP1 and SP2 and the extending patterns EP may be disposed in the same layer. The connection patterns CP may be disposed in a layer different from those of the first and second sensing parts SP1 and SP2 and the extending patterns EP.

Hereinafter, when viewed in a plan view, the non-active region NAA adjacent to an upper portion of the active region AA is referred to as an upper non-active region NAA.

The guard line GRL, the ground line GNL, and the electromagnetic attenuating line EML may be spaced apart from the sensing lines TXL and RXL and may be disposed in the non-active region NAA. The guard line GRL, the ground line GNL, and the electromagnetic attenuating line EML may surround three sides of the active region AA having the shape of a rectangle. For example, the guard line GRL, the ground line GNL, and the electromagnetic attenuating line EML may be disposed in the left non-active region NAA, the right non-active region, NAA and the upper non-active region NAA.

The guard line GRL, the ground line GNL, and the electromagnetic attenuating line EML may be electrically connected to the third pads PD3 disposed in the lower non-active region NAA adjacent to one remaining side of the active region AA.

The guard line GRL, the ground line GNL, and the electromagnetic attenuating line EML are electrically connected to the (3-1)-th pads PD3-1 and may extend along the edges of the input sensing part ISP in the left non-active region NAA, the upper non-active region NAA, and the right non-active region NAA. The guard line GRL, the ground line GNL, and the electromagnetic attenuating line EML may extend along the edges of the input sensing part ISP and may be electrically connected to the (3-2)-th pads PD3-2.

First ends of the guard line GRL, the ground line GNL, and the electromagnetic attenuating line EML may be electrically connected to the (3-1)-th pads PD3-1. Opposite ends of the guard line GRL, the ground line GNL, and the electromagnetic attenuating line EML may extend along the edges of the input sensing part ISP and may be connected to the (3-2)-th pads PD3-2.

The guard line GRL, the ground line GNL, and the electromagnetic attenuating line EML may be disposed at the outside of the sensing lines TXL and RXL in the non-active region NAA. For example, the guard line GRL, the ground line GNL, and the electromagnetic attenuating line EML may be disposed at the outside of the second sensing lines RXL in the left non-active region NAA and the right non-active region NAA.

The electromagnetic attenuating line EML may be disposed between the guard line GRL and the ground line GNL, and the guard line GRL may be closer to the active region AA, than is the electromagnetic attenuating line EML and the ground line GNL. The guard line GRL may be closer to the sensing lines TXL and RXL, than is the electromagnetic attenuating line EML and the ground line GNL. The ground line GNL may be disposed at an outside of the electromagnetic attenuating line EML.

A portion of the guard line GRL, a portion of the ground line GNL, and a portion of the electromagnetic attenuating line EML may be open. For example, the portion of the guard line GRL, the portion of the ground line GNL, and the portion of the electromagnetic attenuating line EML may be open in the upper non-active region NAA.

The sealing layer SAL may overlap the non-active region NAA. The sealing layer SAL may surround the active region AA. The sealing layer SAL may be closer to the active region AA, rather than the first, second, and third pads PD1, PD2, and PD3 in the lower non-active region NAA.

The guard line GRL, the ground line GNL, and the electromagnetic attenuating line EML may overlap with the sealing layer SAL. For example, the guard line GRL, the ground line GNL, and the electromagnetic attenuating line EML, which surround the active region AA, may overlap the sealing layer SAL, except for the guard line GRL, the ground line GNL, and the electromagnetic attenuating line EML adjacent to the third pads PD3.

In FIG. 9, portions of the guard line GRL, the ground line GNL, and the electromagnetic attenuating line EML adjacent to the third pads PD3 may be adjacent to the third pads PD3 while extending in the first direction DR1.

A ground voltage may be applied to the ground line GNL. The ground line GNL may be connected to the ground terminal of the display device DD through the (3-1)-th pad PD3-1 and the (3-2)-th pad PD3-2. External static electricity may be applied to the input sensing part ISP. In this case, the external static electricity may be discharged to the ground terminal through the ground line GNL. Accordingly, the input sensing part ISP may be protected from the external static electricity through the ground line GNL.

The guard line GRL may be connected to the sensing controller through the (3-1)-th pad PD3-1 and the (3-2)-th PD3-2. The sensing controller may apply a particular signal to the guard line GRL.

A coupling phenomenon may be made between the ground line GNL and the sensing lines TXL and RXL, due to the potential difference between the ground line GNL and the sensing lines TXL and RXL. For example, the noise may be produced due to the mutual interference.

To reduce the phenomenon, the particular signal may be applied to the guard line GRL. The guard line GRL may reduce the coupling phenomenon between the ground line GNL and the sensing lines TXL and RXL, while being disposed between the ground line GNL and the sensing lines TXL and RXL.

The electromagnetic attenuating line EML may be connected to the sensing controller through the (3-1)-th pad PD3-1 and the (3-2)-th PD3-2. The sensing controller may apply an offset signal having a phase that is reverse to a phase of the driving signal, to the electromagnetic attenuating line EML.

When a driving signal having a specific frequency is applied to the first sensing electrodes SE1, the undesirable electromagnetic wave resulting from the driving signal may be radiated in the form of an electromagnetic signal. The electromagnetic signal may serve as noise (e.g., EMI) for another device to disturb the other device. For example, the electromagnetic signal of the input sensing part ISP may exert an influence on the operation of the display panel DP.

As the offset signal having a phase that is reverse to a phase of the driving signal is applied to the electromagnetic attenuating line EML, the electromagnetic signal generated from the input sensing part ISP may be attenuated due to the offset signal.

According to an embodiment of the present disclosure, the noise and the electromagnetic signal are reduced, and the input sensing part ISP is protected from the external static electricity, in the input sensing part ISP by the guard line GRL, the electromagnetic attenuating line EML, and the ground line GNL. Accordingly, the reliability for the operation of the input sensing part ISP may be increased.

Figure 10:
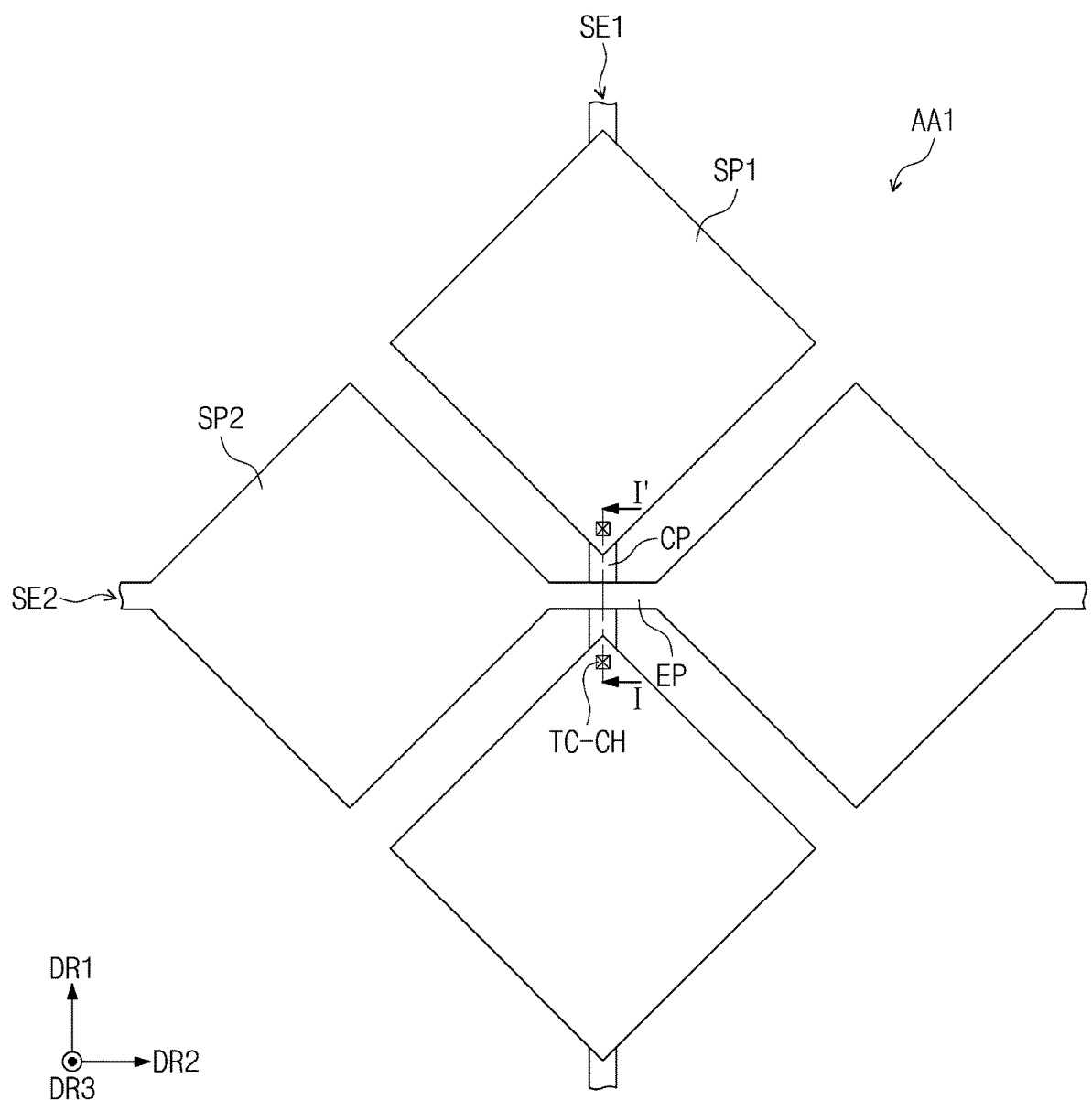
FIG. 10 is an enlarged view of a region AA1 illustrated in FIG. 9.

FIG. 10 is an enlarged view of a region AA1 illustrated in FIG. 9.

For example, FIG. 10 illustrates two first sensing parts adjacent to each other and two second sensing parts adjacent to each other.

Referring to FIG. 10, the first sensing electrode SE1 may include a pair of first sensing parts SP1 arranged in the first direction DR1, and the connection pattern CP disposed between the first sensing parts SP1 to connect the first sensing parts SP1 to each other. For example, an insulating layer may be disposed between the connection patterns CP and the first sensing parts SP1, and the connection patterns CP may be connected to the first sensing parts SP1 through contact holes TC-CH defined in the insulating layer.

The second sensing electrode SE2 may include a pair of second sensing parts SP2 arranged in the second direction DR2, and the extending pattern EP disposed between the second sensing parts SP2 while extending from the second sensing parts SP2. The extending pattern EP may be insulated from the connection pattern CP and may extend while crossing the connection pattern CP. The extending pattern EP may be formed integrally with the second sensing parts SP2.

The first and second sensing parts SP1 and SP2 may be disposed in the same layer as that of the extending pattern EP. The connection pattern CP may be disposed in a layer different from that of the first and second sensing parts SP1 and SP2 and the extending pattern EP.

Figure 11:
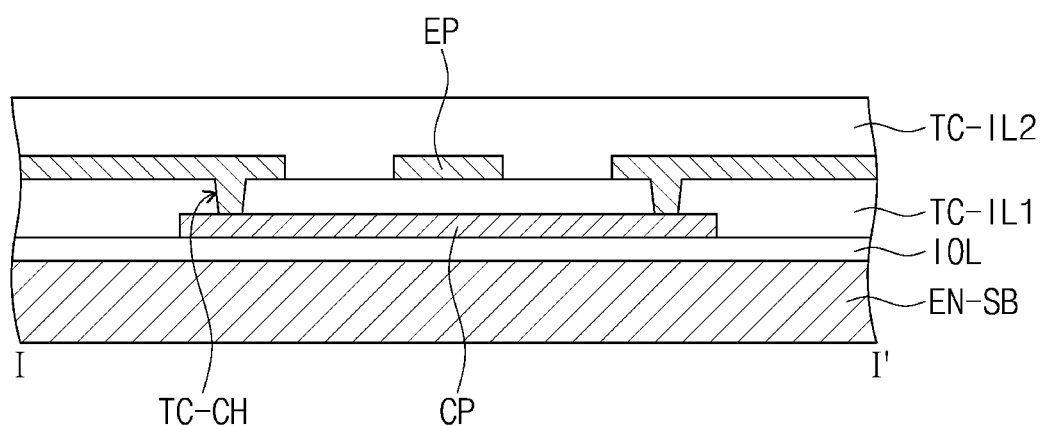
FIG. 11 is a cross-sectional view taken along line I-I' of FIG. 10.

FIG. 11 is a cross-sectional view taken along line I-I' of FIG. 10.

Referring to FIGS. 10 and 11, the insulating layer IOL may be disposed on the encapsulating substrate EN-SB. The connection pattern CP may be disposed on the insulating layer IOL. The connection pattern CP may be formed by the first conductive pattern CPT1 illustrated in FIG. 7. The first insulating layer TC-IL1 may be disposed on the connection pattern CP. The first insulating layer TC-IL1 may be disposed on the insulating layer IOL and may cover the connection pattern CP.

The first sensing parts SP1 and the extending pattern EP may be disposed on the first insulating layer TC-IL1. The second sensing parts SP2 disposed in the same layer as that of the extending pattern EP may be disposed on the first insulating layer TC-IL1. The first and second sensing parts SP1 and SP2 and the extending pattern EP may be formed by the second conductive pattern CPT2 illustrated in FIG. 7.

The first sensing parts SP1 may be connected to the connection pattern CP through the contact holes TC-CH defined in the first insulating layer TC-IL1. Accordingly, the first sensing parts SP1 may be connected to each other through the connection pattern CP.

The second insulating layer TC-IL2 may be disposed on the first sensing parts SP1 and the extending pattern EP. The second insulating layer TC-IL2 may be disposed on the first insulating layer TC-IL1 and may cover the first sensing parts SP1 and the extending pattern EP. The second insulating layer TC-IL2 may be disposed on the first insulating layer TC-IL1 and may cover the second sensing parts SP2.

Figure 12:
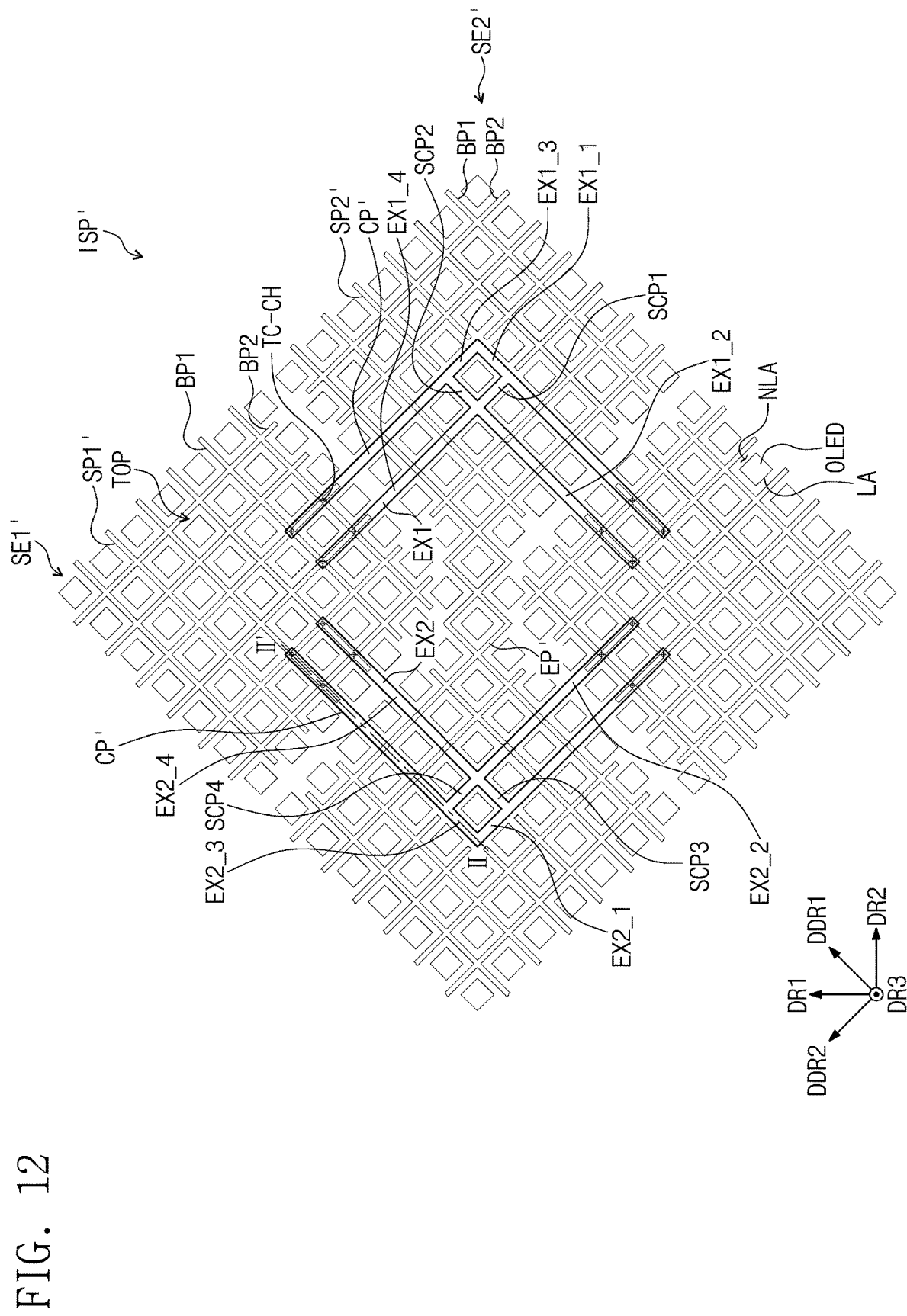
FIG. 12 is a view illustrating the configuration of first and second sensing parts of the input sensing part, a connection pattern, and an extending pattern illustrated in FIG. 5.
Figure 13:
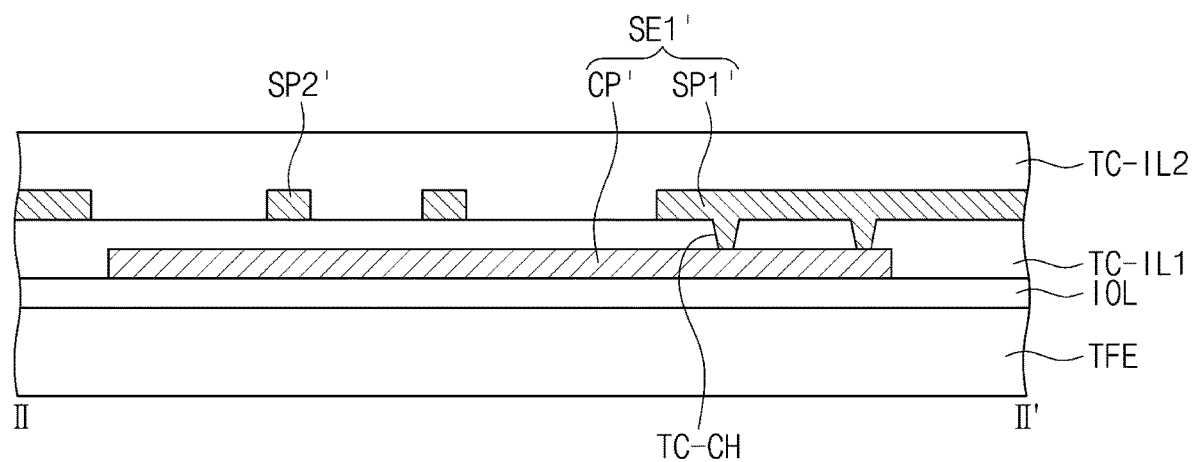
FIG. 13 is a cross-sectional view taken along line II-II' of FIG. 12.

FIG. 12 is a view illustrating the configuration of the first and second sensing parts of the input sensing part, the connection pattern, and the extending pattern illustrated in FIG. 5. FIG. 13 is a cross-sectional view taken along line II-II' of FIG. 12.

FIG. 12 illustrates a plan view corresponding to FIG. 10.

Referring to FIG. 12, the input sensing part ISP' may include components illustrated in FIG. 12. The input sensing part ISP' may include first and second sensing electrodes SE1' and SET. The first and second sensing electrodes SE1' and SE2' may be disposed on the thin film encapsulating layer TFE illustrated in FIGS. 5 and 8.

The first sensing electrode SE1' may include a connection pattern CP' disposed between the first sensing parts SP1' and the first sensing parts SP1'. The second sensing electrode SE2' may include an extending pattern EP' disposed between the second sensing parts SP2' and the second sensing parts SP2'.

The first sensing parts SP1' and the second sensing parts SP2' may have a mesh or screen shape. The first sensing parts SP1' and the second sensing parts SP2' may include a plurality of first branch parts BP1 extending in a first diagonal direction DDR1 and a plurality of second branch parts BP2 extending in a second diagonal direction DDR2, such that the first sensing parts SP1' and the second sensing parts SP2' have a mesh or screen shape.

The first diagonal direction DDR1 may be defined as a direction crossing the first and second directions DR1 and DR2 on a plane defined by the first and second directions DR1 and DR2. The second diagonal direction DDR2 may be defined as a direction crossing the first diagonal direction DDR1 on a plane defined by the first and second directions DR1 and DDR1. For example, the first and second directions DR1 and DR2 cross each other perpendicularly, and the first diagonal direction DDR1 and the second diagonal direction DDR2 may cross each other perpendicularly.

The first branch parts BP1 of each of the first and second sensing parts SP1' and SP2' may cross the second branch parts BP2 of each of the first and second sensing parts SP1 and SP2, and the first branch parts BP1 and the second branch parts BP2 may be integrally formed with each other. The rhombus-shaped touch openings TOP may be defined by the first branch parts BP1 and the second branch parts BP2.

When viewed in a plan view, light emitting regions LA may be disposed in the touch openings TOP. The light emitting devices OLED may be disposed in the light emitting regions LA. The light emitting regions LA may be the light emitting region LA illustrated in FIG. 8. The first and second sensing parts SP1' and SP2' may be disposed in the non-light emitting region NLA. Since the first and second sensing parts SP1' and SP2' are disposed in the non-light emitting region NLA, light generated in the light emitting regions LA may be normally emitted without influences by the first and second sensing parts SP1' and SP2'.

The connection patterns CP' may extend toward two first sensing parts SP1' adjacent to each other in the first direction DR1 through the two second sensing parts SP2' adjacent to each other in the second direction DR2. The connection patterns CP' may extend without overlapping the extending pattern EP' and may connect the first sensing parts SP1' each other. The connection pattern CP may be connected to the first sensing parts SP1' through a plurality of contact holes TC-C. The structure of the contact holes TC-CH will be illustrated in FIG. 13 below. The connection pattern CP' may be disposed in a layer different from those of the extending pattern EP', the first sensing parts SP1', and the second sensing parts SP2'.

The extending pattern EP' may be disposed between the first sensing parts SP1' and may extend from the second sensing parts SP2'. The second sensing parts SP2' and the extending pattern EP' may be integrally formed. The extending pattern EP' may have a mesh or screen shape. When viewed in a plan view, the extending patterns EP' may be disposed between the connection patterns CP' and might not overlap the connection patterns CP'. The extending pattern EP', the first sensing parts SP', and the second sensing parts SP2' may be disposed in the same layer and may be formed by being simultaneously patterned with the same material.

The extending pattern EP' may include a first extending part EX1 and a second extending part EX2 having the shape corresponding to the shape of the first extending part EX1. The extending pattern EP' may be disposed between the first extending part EX1 and the second extending part EX2.

The first extending part EX1 may extend through a region overlapped with one second sensing part SP2 of the second sensing parts SP2' and may be connected to the first sensing parts SP1. The second extending part EX2 may extend through a region overlapped with another one second sensing part SP2 of the second sensing parts SP2' and may be connected to the first sensing parts SP1.

Hereinafter, the first sensing parts SP1' include an upper first sensing part SP1' and a lower first sensing part SP1' defined depending on the relative arrangement positions. In addition, the second sensing parts SP2' include a left second sensing part SP2' and a right second sensing part SP2' defined depending on the relative arrangement positions.

Portions of the first and second extending parts EX1 and EX2 adjacent to sides of the first and second extending pans EX1 and EX2 may be connected to the lower first sensing part SP1' through the plurality of contact holes TC-CH. Portions of the first and second extending parts EX1 and EX2 adjacent to opposite sides of the first and second extending parts EX1 and EX2 may be connected to the upper first sensing pan SP1' through the plurality of contact holes TC-CH.

The first extending part EX1 may include a first sub-extending pan EX1_1 and a second sub-extending part EX1_2, which extend in the first diagonal direction DDR1, a third sub-extending part EX1_3 and a fourth sub-extending pan EX1_4, which extend in the second diagonal direction DDR2, a first sub-conductive pattern SCP1 extending in the second diagonal direction DDR2, and a second sub-conductive pattern SCP2 extending in the first diagonal direction DDR1.

Portions of the first and second sub-extending parts EX1_1 and EX1_2 adjacent to sides of the first and second sub-extending parts EX1_1 and EX1_2 may be connected to the lower first sensing part SP1' through the plurality of contact holes TC-CH. Portions of the third and fourth sub-extending parts EX1_3 and EX1_4 adjacent to sides of the third and fourth sub-extending parts EX1_3 and EX1_4 may be connected to the upper first sensing part SP1' through the plurality of contact holes TC-CH.

The opposite side of the first sub-extending part EX1_1 may extend from an opposite of the third sub-extending part EX1_3. The opposite of the second sub-extending part EX1_2 may extend from the opposite side of the fourth sub-extending part EX1_4. The first sub-conductive pattern SCP1 may extend in the second diagonal direction DDR2 from the opposite of the fourth sub-extending part EX1_4, and may extend to the first sub-extending part EX1_1. The second sub-conductive pattern SCP2 may extend in the first diagonal direction DDR1 from the opposite of the second sub-extending part EX1_2, and may extend to the third sub-extending part EX1_3.

The first sub-extending part EX1_1, the second sub-extending part EX1_2, the third sub-extending part EX1_3, the fourth sub-extending part EX1_4, the first sub-conductive pattern SCP1, and the second sub-conductive pattern SCP2 may be integrated with one another.

The first and second sub-extending parts EX1_1 and EX1_2' may cross a specific number of second branch parts BP2, which are adjacent to the lower first sensing part SP1', of the second branch parts BP2 of the right second sensing part SP2'. The first branch parts BP1 of the right second sensing part SP2' might not be disposed in a region overlapped with the first and second sub-extending parts EX1_1 and EX1_2 and the second sub-conductive pattern SCP2.

The third and fourth sub-extending parts EX1_3 and EX1_4' may cross a specific number of first branch parts BP1, which are adjacent to the upper first sensing part SP1', of the first branch parts BP1 of the right second sensing part SP2'. The second branch parts BP2 of the right second sensing part SP2' might not be disposed in a region overlapped with the third and fourth sub-extending parts EX1_3 and EX1_4 and the first sub-conductive pattern SCP1.

The second extending part EX2 may include a fifth sub-extending part EX2_1 and a sixth sub-extending part EX2_2, which extend in the second diagonal direction DDR2, a seventh sub-extending part EX2_3 and an eighth sub-extending part EX2_4, which extend in the first diagonal direction DDR1, a third sub-conductive pattern SCP3 extending in the first diagonal direction DDR1, and a fourth sub-conductive pattern SCP4 extending in the second diagonal direction DDR2.

The left second sensing part SP2' may have a structure symmetrical to that of the right second sensing part SP2'. The second extending part EX2 may have a structure symmetrical to that of the first extending part EX1. Accordingly, to the extent that an element has not been described in detail herein, it may be assumed that the element is at least similar to a corresponding element that is described elsewhere herein. In particular, the fifth to eighth sub-extending parts EX2_1 to EX2_4 and third and fourth sub-conductive patterns SCP3 and SCP4 may be understood to share the description of corresponding elements described herein.

Referring to FIG. 13, the insulating layer IOL may be disposed on the thin film encapsulating layer TFE and the connection pattern CP' may be disposed on the insulating layer IOL. The first insulating layer TC-IL1 may be disposed on the connection pattern CP' and the insulating layer IOL. The first insulating layer TC-IL1 may be disposed on the insulating layer IOL and may cover the connection pattern CP'. The connection pattern CP' may be formed by the first conductive pattern CPT1 illustrated in FIG. 8.

The first sensing parts SP1' and the second sensing parts SP2' may be disposed on the first insulating layer TC-IL1. The extending pattern EP' integrally formed with the second sensing parts SP2' may be disposed on the first insulating layer TC-IL1. The connection pattern CP' may be connected to the first sensing parts SP1' through a plurality of contact holes TC-CH defined in the first insulating layer TC-IL1.

The first and second sensing parts SP1' and SP2' and the extending pattern EP' may be formed by the second conductive pattern CPT2 illustrated in FIG. 8.

The second insulating layer TC-IL2 may be disposed on the first and second sensing parts SP1' and SP2' and the first insulating layer TC-IL1. The second insulating layer TC-IL2 may be disposed on the first insulating layer TC-IL1 and may cover the first and second sensing parts SP1' and SP2'.

Figure 14:
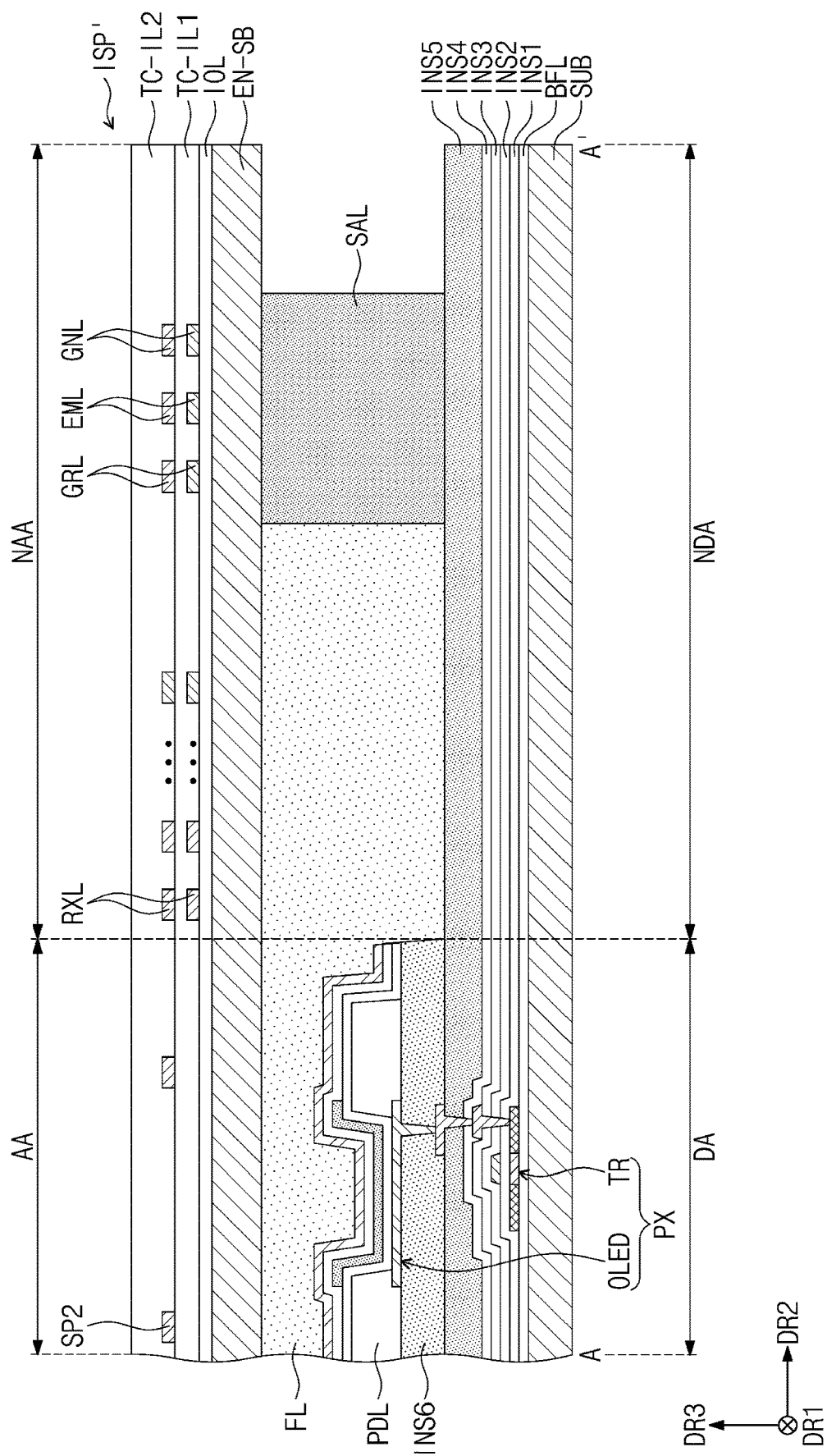
FIG. 14 is a cross-sectional view taken along line A-A' of FIG. 9.

FIG. 14 is a cross-sectional view taken along line A-A' of FIG. 9.

For example, the structure of the right non-active region NAA is illustrated in the cross-sectional view of FIG. 14. The left non-active region NAA has the same structure as that the right non-active region NAA, except that the left non-active region NAA is symmetrical to the light non-active region NAA.

Referring to FIG. 14, when viewed in a plan view, the active region AA may overlap the display region DA, and the non-active region NAA may overlap the non-display region NDA. The buffer layer BFL and the first to fifth insulating layers INS1 to INS5 disposed on the display region DA may extend to the non-display region NDA.

The sixth insulating layer INS6 and the pixel defining layer PDL may extend to a boundary between the display region DA and the non-display region NDA. The boundary between the display region DA and the non-display region NDA may be defined as a part adjacent to the outer most light emitting device OLED.

The sealing layer SAL may be disposed between the substrate SUB and the encapsulating substrate EN-SB and may also be disposed on the fifth insulating layer INS5. The sealing layer SAL may overlap the non-active region NAA, when viewed in a plan view.

The second sensing lines RXL, the guard line GRL, the ground line GNL, and the electromagnetic attenuating line EML may be disposed on the encapsulating substrate EN-SB.

The second sensing lines RXL, the guard line GRL, the ground line GNL, and the electromagnetic attenuating line EML may be disposed on the insulating layer IOL. The second sensing lines RXL, the guard line GRL, the ground line GNL, and the electromagnetic attenuating line EML may include multiple layers. For example, each of the second sensing lines RXL, the guard line GRL, the ground line GNL, and the electromagnetic attenuating line EML may include lines (hereinafter, a first line and a second line) stacked in two layers while overlapping each other.

The first line of each of the second sensing lines RXL, the guard line GRL, the ground line GNL, and the electromagnetic attenuating line EML may be disposed on the insulating layer IOL The first insulating layer TC-IL1 may be disposed on the first line of each of the second sensing lines RXL, the guard line GRL, the ground line GNL, and the electromagnetic attenuating line EML.

The second line of each of the second sensing lines RXL, the guard line GRL, the ground line GNL, and the electromagnetic attenuating line EML may be disposed on the first insulating layer TC-IL1. The second insulating layer TC-IL2 may be disposed on the second line of each of the second sensing lines RXL, the guard line GRL, the ground line GNL, and the electromagnetic attenuating line EML.

Although each of the second sensing lines RXL, the guard line GRL, the ground line GNL, and the electromagnetic attenuating line EML includes multiple layers, an embodiment of the present disclosure is not necessarily limited thereto. Each of the second sensing lines RXL, the guard line GRL, the ground line GNL, and the electromagnetic attenuating line EML includes one of the first line and the second line to have a single-layer line structure.

When viewed in a plan view, the second sensing lines RXL may be disposed between the sealing layer SAL and the active region AA. For example, when viewed in a plan view, the second sensing lines RXL might not overlap the sealing layer SAL.

When viewed in a plan view, the guard line GRL, the ground line GNL, and the electromagnetic attenuating line EML may overlap the sealing layer SAL while being spaced apart from the second sensing lines RXL. Accordingly, the guard line GRL, the ground line GNL, and the electromagnetic attenuating line EML may be more stably disposed on the sealing layer SAL.

The guard line GRL, the ground line GNL, and the electromagnetic attenuating line EML may be disposed on the sealing layer SAL, instead of being disposed inward of the sealing layer SAL. As a region having the sealing layer SAL is utilized, the guard line GRL, the ground line GNL, and the electromagnetic attenuating line EML may be disposed on the sealing layer SAL.

When the guard line GRL, the ground line GNL, and the electromagnetic attenuating line EML are disposed at an inside of the sealing layer SAL, a non-active region NAA for disposing the guard line GRL, the ground line GNL, and the electromagnetic attenuating line EML together with the sensing lines RXL should be ensured at the inside of the sealing layer SAL.

Figure 19:
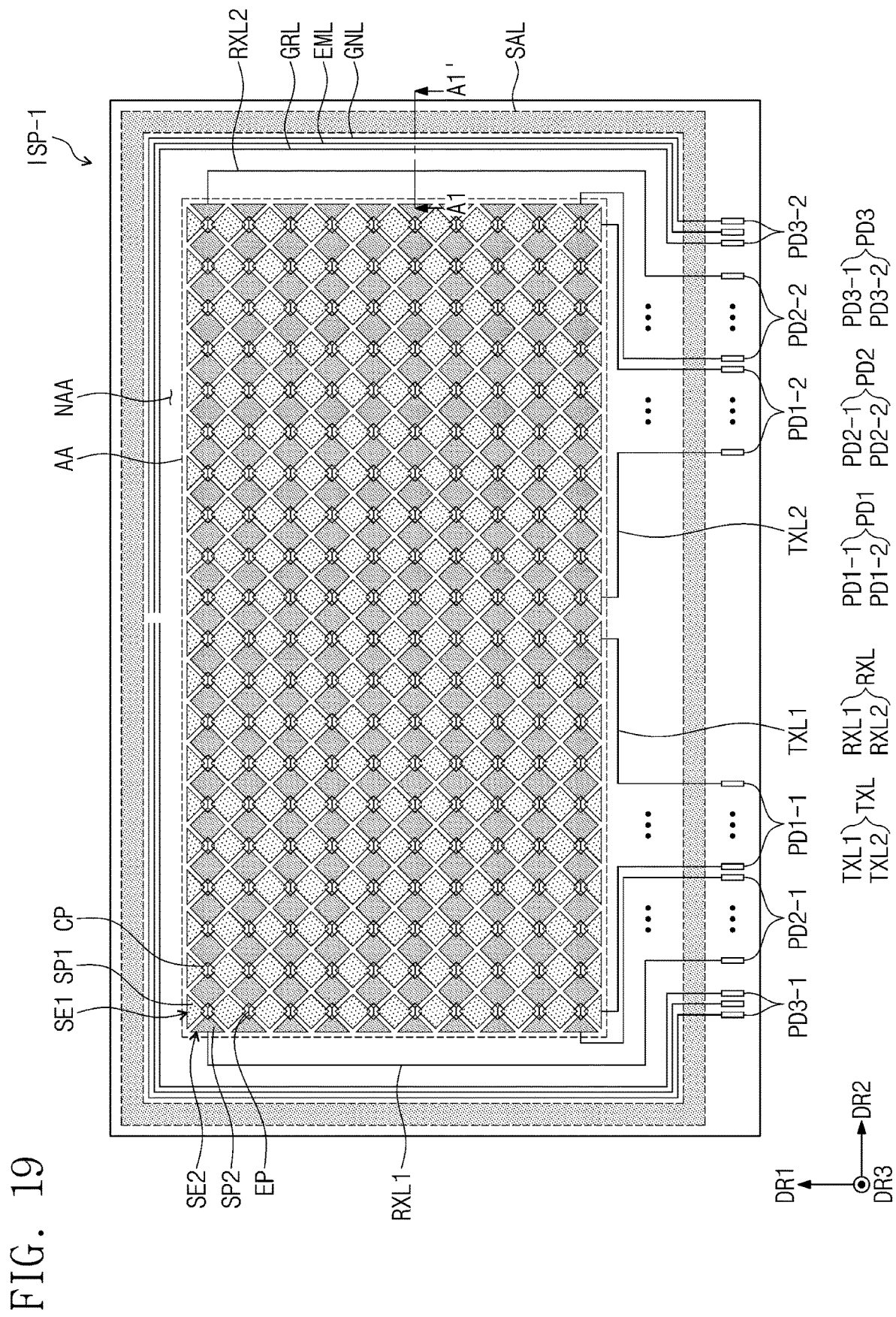
FIG. 19 is a plan view illustrating an input sensing part, according to an embodiment of the present disclosure.
Figure 20:
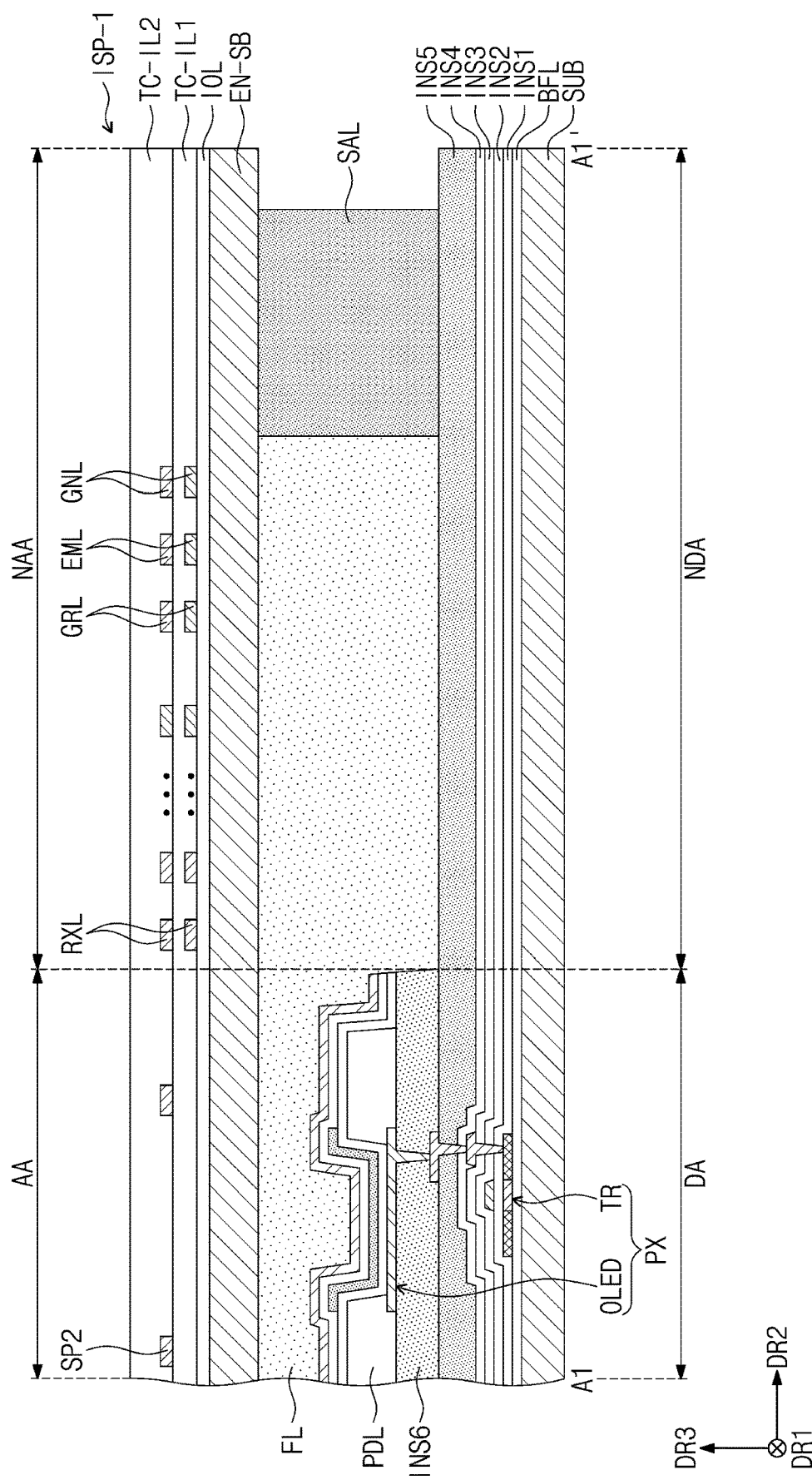
FIG. 20 is a cross-sectional view taken along line A1-A1' of FIG. 19.

According to an embodiment of the present disclosure, the guard line GRL, the ground line GNL, and the electromagnetic attenuating line EML may be disposed on the sealing layer SAL, instead of being disposed at the inside of the sealing layer SAL. When the guard line GRL, the ground line GNL, and the electromagnetic attenuation line EML are disposed together with the sensing lines RXL in an inactive area NAA inside the sealing layer SAL, an area for disposing the lines may be small. However, in the embodiment of the present invention, since the guard line GRL, the ground line GNL, and the electromagnetic attenuation line EML are disposed on the sealing layer SAL, the sensing lines RXL are only disposed in the non-active area NAA inside the sealing layer SAL. Accordingly, a space in the non-active region NAA to dispose the sensing lines RXL may be sufficiently ensured. However, an embodiment of the present disclosure is not necessarily limited thereto. The guard line GRL, the ground line GNL, and the electromagnetic attenuating line EML may be disposed at the inside of the sealing layer SAL, as is illustrated in FIGS. 19 and 20.

When the guard line GRL is adjacent to the sensing lines RXL, the coupling phenomenon may be efficiently reduced between the sensing lines RXL and the ground line GNL. When the ground line GNL is disposed at the outer most part, the static electricity introduced from the outside may be efficiently discharged. Accordingly the electromagnetic attenuating line EML may be disposed between the guard line GRL and the ground line GNL.

However, an embodiment of the present disclosure is not necessarily limited thereto. The guard line GRL, the ground line GNL, and the electromagnetic attenuating line EML may be disposed at various positions, and an embodiment will be described below with reference to FIGS. 23 and 24 below.

According to an embodiment, in the display panel DP' illustrated in FIG. 5, the guard line GRL, the ground line GNL, and the electromagnetic attenuating line EML may be disposed on the thin film encapsulating layer TFE.

Figure 15:
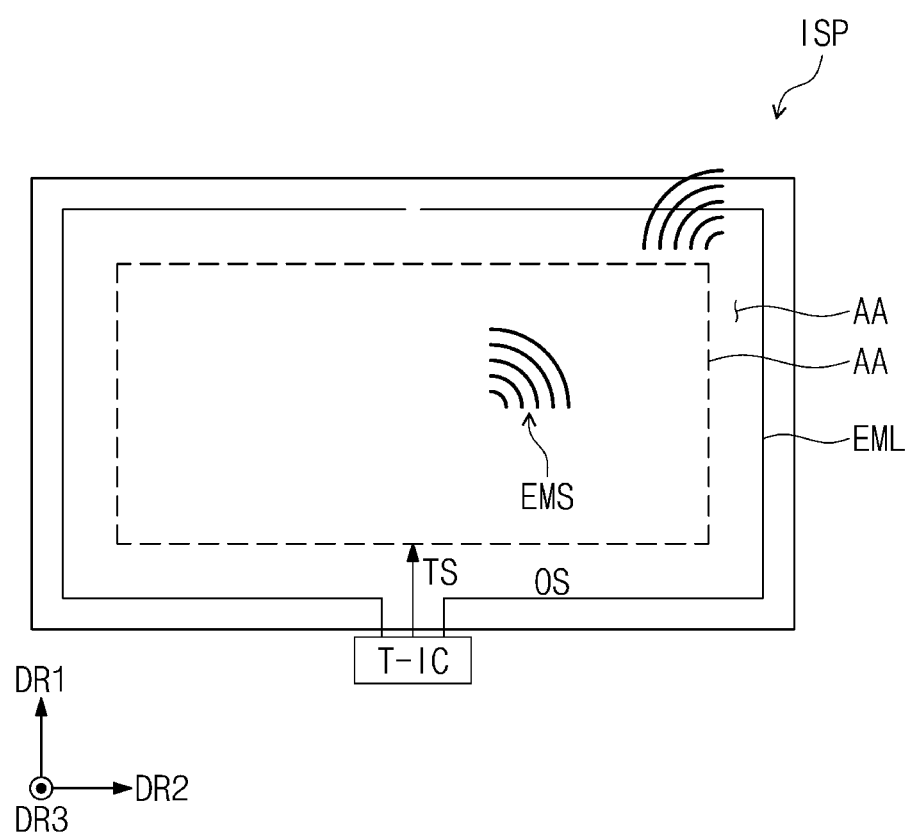
FIGS. 15 and 16 are views illustrating a sensing controller connected to an electromagnetic attenuating line illustrated in FIG. 9.
Figure 16:
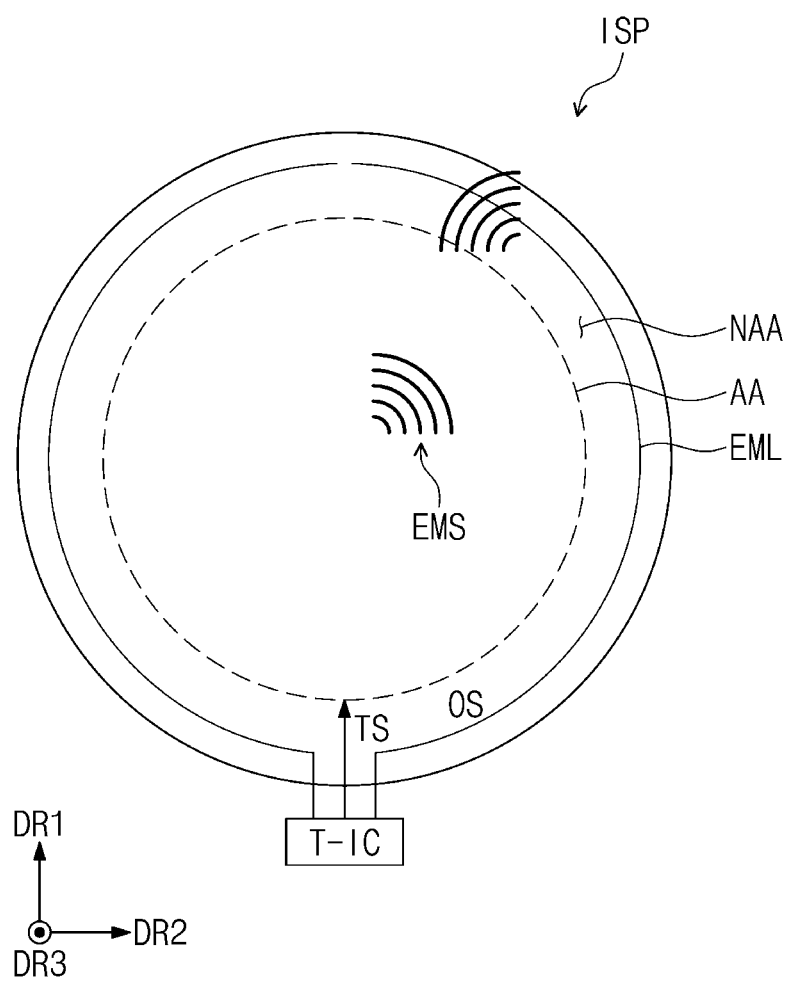
Figure 17A:
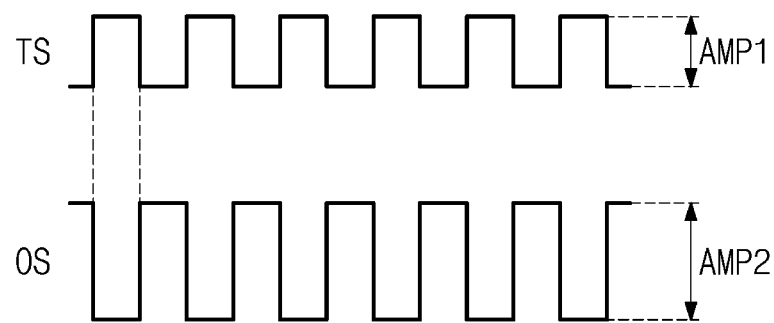
FIG. 17A is a view illustrating timing of a driving signal applied to first sensing electrodes illustrated in FIG. 9, and timing of an offset signal applied to an electromagnetic attenuating line illustrated in FIG. 9.

FIGS. 15 and 16 are views illustrating a sensing controller connected to the electromagnetic attenuating line illustrated in FIG. 9. FIG. 17A is a view illustrating timing of a driving signal applied to first sensing electrodes illustrated in FIG. 9, and timing of an offset signal applied to an electromagnetic attenuating line illustrated in FIG. 9.

The following description will be made with reference to FIG. 9, and FIG. 15 to FIG. 17A.

Referring to FIGS. 15 and 16, the input sensing part ISP may include a sensing controller T-IC. The sensing controller T-IC may generate a driving signal TS and an offset signal OS. The driving signal TS may be applied to the active region AA, and the offset signal OS may be applied to the electromagnetic attenuating line EML. The driving signal TS may be applied to the first sensing electrodes SE1 disposed in the active region AA.

The input sensing part ISP may have various shapes. For example, referring to FIG. 15, the input sensing part ISP may have the shape of a rectangle. The active region AA may have the shape of a rectangle. Referring to FIG. 16, the input sensing part ISP may have the shape of a circle. The active region AA may also have the shape of a circle. The shape of the input sensing part ISP may substantially correspond to the shape of the display panel DP. The display panel DP may have the shape of a rectangle or a circle.

Referring to FIG. 9, and FIGS. 15 to 17A, the driving signal TS having a specific frequency may be applied to the first sensing electrodes SE1, and the offset signal OS having a specific frequency may be applied to an electromagnetic attenuating line EML. The offset signal OS may have a phase that is reverse to a phase of the driving signal TS. The offset signal OS may have a second amplitude AMP2 greater than a first amplitude AMP1 of the driving signal TS.

An electromagnetic signal EMS may be generated from the input sensing part ISP by the driving signal TS having the specific frequency. Since the offset signal OS has a phase that is reverse to a phase of the driving signal TS applied to the active region AA, the electromagnetic signal EMS may be offset by the offset signal OS.

The intensity of the electromagnetic signal EMS may be proportional to the number of the first sensing electrodes SE1 and the area size of the first sensing electrodes SE1. Accordingly, the electromagnetic signal EMS may be more strongly generated. According to an embodiment of the present disclosure, since the offset signal OS has an amplitude greater than the amplitude of the driving signal TS, the electromagnetic signal EMS having the stronger intensity may be more offset.

FIGS. 17B to 17F are views illustrating timings of a driving signal and an offset signal, according to an embodiment of the present disclosure.

Figure 17B:
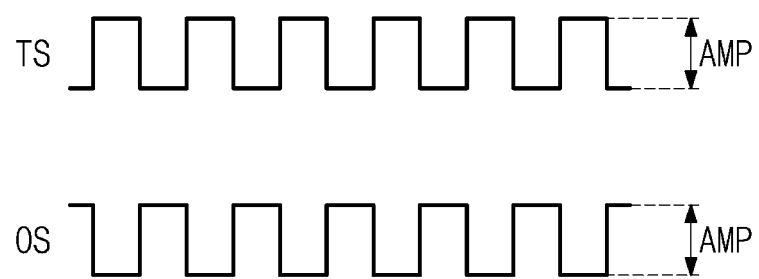
FIGS. 17B to 17F are views illustrating timing of a driving signal and an offset signal, according to an embodiment of the present disclosure.

Referring to FIG. 17B, the offset signal OS may have a phase that is reverse to a phase of the driving signal TS. The amplitude AMP of the offset signal OS may be equal to the amplitude AMP of the driving signal TS.

Figure 17C:
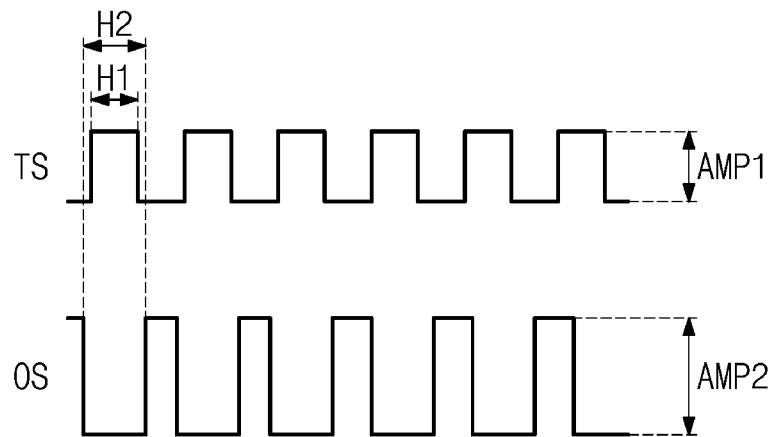

Referring to FIG. 17C, the offset signal OS may have a phase that is reverse to a phase of the driving signal TS. The offset signal OS may have the second amplitude AMP2 greater than the first amplitude AMP1 of the driving signal TS. The driving signal TS may have an activated duration H1. The activated duration may be defined as a high-level duration for one period. The offset signal OS may have a deactivated duration H2. The deactivated duration H2 may be defined as a low-level duration for one period. The deactivated duration H2 of the offset signal OS may be greater than the activated duration H1 of the driving signal TS.

Figure 17D:
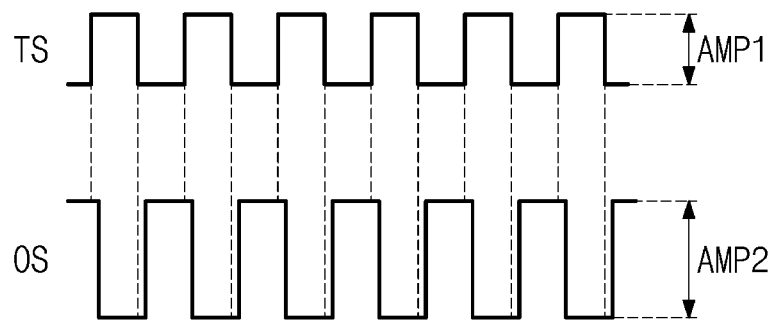

Referring to FIG. 17D, the offset signal OS may have a phase that is reverse to a phase of the driving signal TS. The offset signal OS may have the second amplitude AMP2 that is greater than the first amplitude AMP1 of the driving signal TS. The offset signal OS may be shifted right from the driving signal TS and output. For example, a portion of the low-level duration of the offset signal OS may overlap a portion of the high-level duration of the driving signal TS.

Figure 17E:
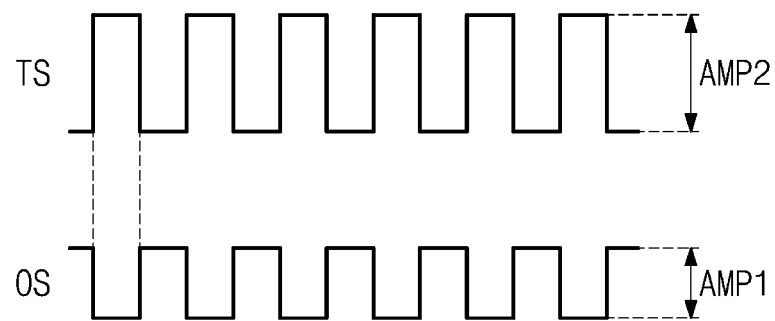

Referring to FIG. 17E, the offset signal OS may have a phase that is reverse to a phase of the driving signal TS. The driving signal TS may have the second amplitude AMP2 that is greater than the first amplitude AMP1 of the offset signal OS.

Figure 17F:
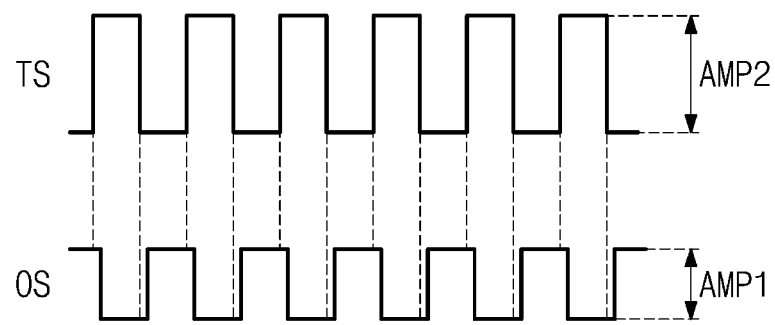

Referring to FIG. 17F, the offset signal OS may have a phase that is reverse to a phase of the driving signal TS. The driving signal TS may have the second amplitude AMP2 that is greater than the first amplitude AMP1 of the offset signal OS. The offset signal OS may be shifted right from the driving signal TS and output. For example, a portion of the low-level duration of the offset signal OS may overlap a portion of the high-level duration of the driving signal TS.

Figure 18A:
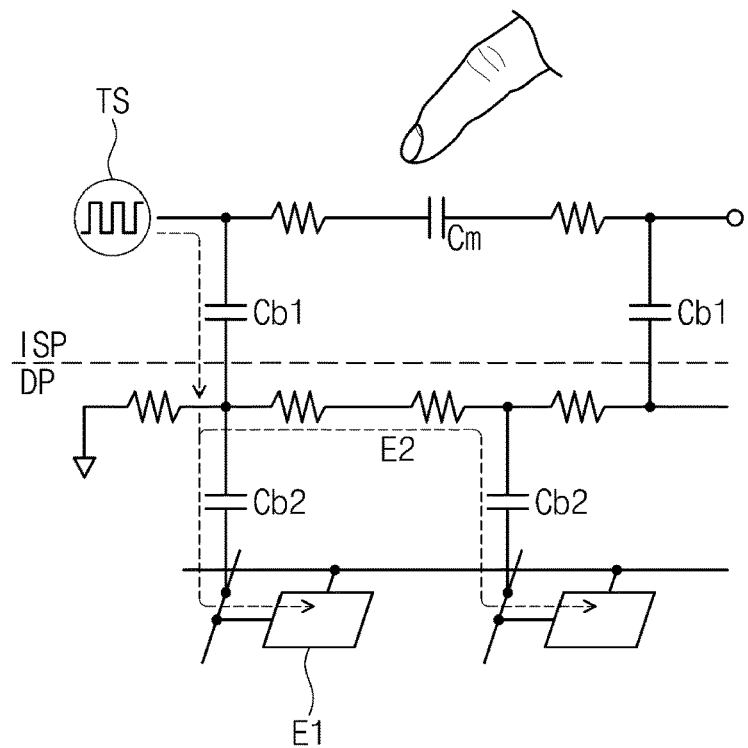
FIG. 18A and FIG. 18B are circuit diagrams illustrating an offset operation of an electrical signal through an offset signal illustrated in FIG. 17A.
Figure 18B:
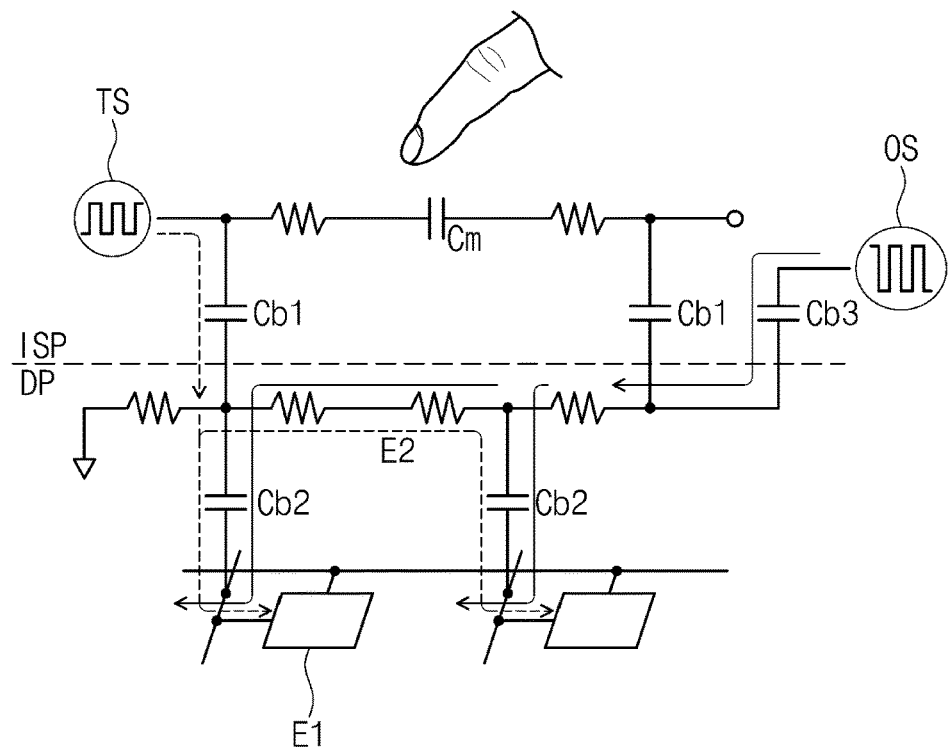

FIG. 18A and FIG. 18B are circuit diagrams illustrating an offset operation of an electrical signal by an offset signal illustrated in FIG. 17A.

The following description will be described with reference to FIG. 9, FIG. 17A, FIG. 18A, and FIG. 18B.

Referring to FIG. 9, FIG. 18A, and FIG. 18B, the input sensing part ISP may include a capacitor Cm formed by the first and second sensing electrodes SE1 and SE2. Resistors following the first and second sensing electrodes SE1 and SE2 are illustrated together with the capacitor Cm.

First parasitic capacitors Cb1 may be formed in the input sensing part ISP. The first parasitic capacitors Cb1 may be formed by a conductor of the display panel DP and a conductor of the input sensing part ISP. For example, the conductors of the input sensing part ISP may be the first and second sensing electrodes SE1 and SE2, and the conductor of the display panel DP may be a second electrode E2.

Second parasitic capacitors Cb2 may be formed in the display panel DP. The second parasitic capacitors Cb2 may be formed by conductors inside the display panel DP. For example, the second parasitic capacitors Cb2 may be formed by the lines connected to a first electrode E1 and the second electrode E2.

Referring to FIGS. 9, 17A, and 18A, when the driving signal TS is applied to the input sensing part ISP, the electromagnetic signal (marked with a dotted arrow in FIG. 18A) derived from the driving signal TS may be applied to the first electrodes E1 through the first and second parasitic capacitors Cb1 and Cb2. In this case, as the electromagnetic signal from the driving signal TS serves as noise for the display panel DP, the display panel DP might not normally operate.

Referring to FIGS. 9 and 18B, a third parasitic capacitor Cb3 formed by the electromagnetic attenuating line EML and the conductor of the display panel DP may be further disposed in the input sensing part ISP.

Referring to FIGS. 9, 17A, and 18A, the electromagnetic signal (marked with a dotted arrow) derived from the driving signal TS may be applied to the first electrodes E1 of the display panel DP through the first and second parasitic capacitors Cb1 and Cb2. An electromagnetic signal (marked with a solid arrow in FIG. 18B) from the offset signal OS may be applied to the first electrodes E1 of the display panel DP through the third parasitic capacitor Cb3 formed by the electromagnetic attenuating line EML and the second parasitic capacitors Cb2 of the display panel DP.

Accordingly, the electromagnetic signal from the driving signal TS may be offset by the offset signal OS having a phase that is reverse to the phase of the driving signal TS. Accordingly, the electromagnetic signal applied to the display panel DP is attenuated, such that the display panel DP may operate normally.

FIG. 19 is a plan view illustrating an input sensing part, according to an embodiment of the present disclosure. FIG. 20 is a cross-sectional view taken along line A1-A1' of FIG. 19.

FIGS. 19 and 20 are a plan view and a cross-sectional view corresponding to FIG. 9 and FIG. 14. Hereinafter, the configuration of an input sensing part ISP-1 illustrated in FIGS. 19 and 20 will be described while focusing on the difference from the input sensing part ISP illustrated in FIG. 9 and FIG. 14.

Referring to FIGS. 19 and 20, the guard line GRL, the ground line GNL, and the electromagnetic attenuating line EML of the input sensing part ISP-1 might not overlap the sealing layer SAL when viewed in a plan view. For example, the guard line GRL, the ground line GNL, and the electromagnetic attenuating line EML, which surround the active region AA, might not overlap the sealing layer SAL, except for portions, which are adjacent to the third pads, of the guard line GRL, the ground line GNL, and the electromagnetic attenuating line EML.

When viewed in a plan view, the guard line GRL, the ground line GNL, and the electromagnetic attenuating line EML are spaced apart from the sealing layer SAL and may be closer to the active region AA, rather than the sealing layer SAL.

FIGS. 21 to 24 are cross-sectional views illustrating configurations of an input sensing part, according to an embodiment of the present disclosure.

FIGS. 21 to 24 are cross-sectional views corresponding to FIG. 14. Hereinafter, the configurations of the input sensing parts ISP-2 to ISP-5 illustrated in FIGS. 21 and 24 will be described while focusing on the difference from the input sensing part ISP illustrated in FIG. 14.

Figure 21:
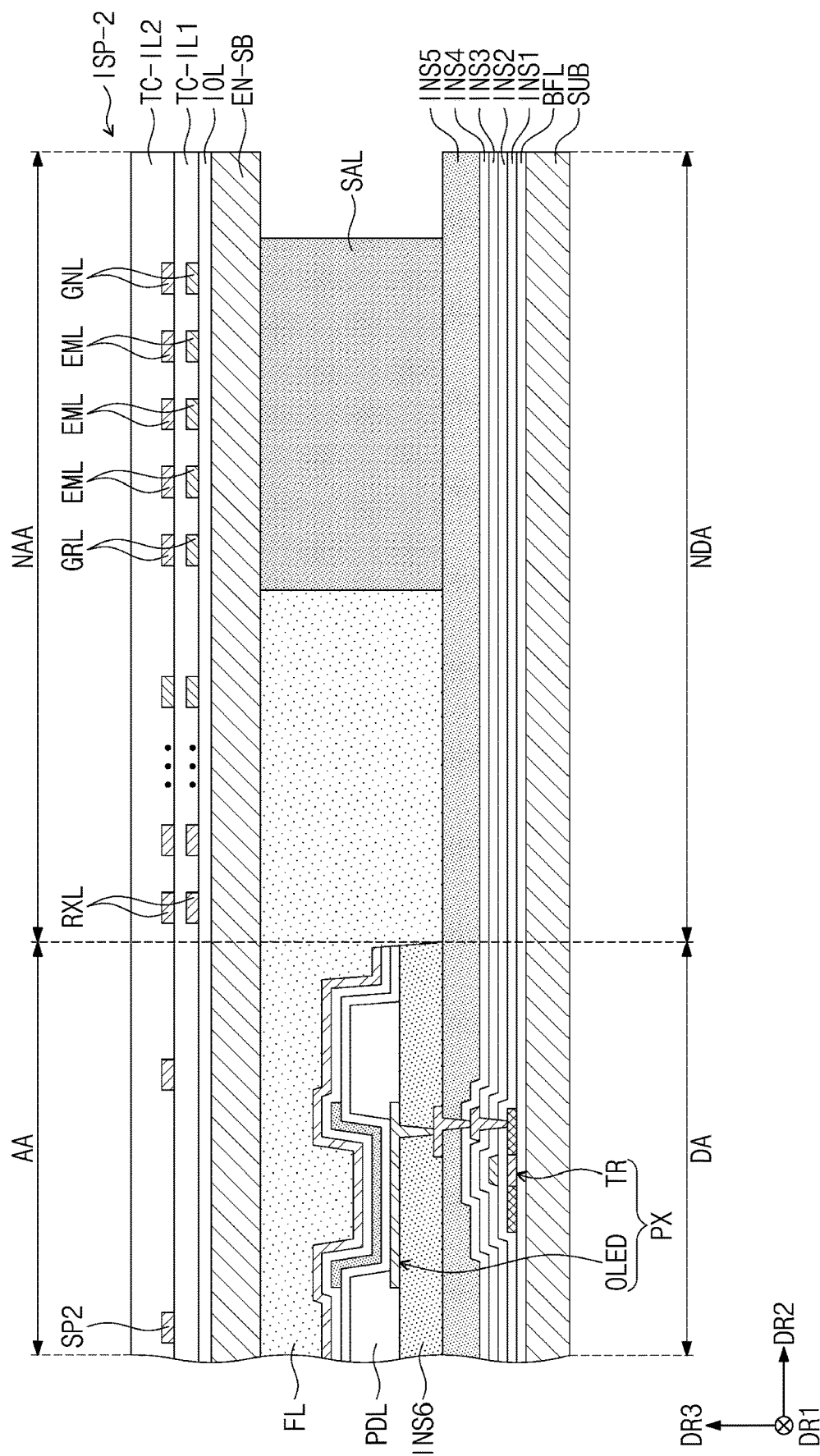
FIGS. 21 to 24 are cross-sectional views illustrating configurations of an input sensing part, according to an embodiment of the present disclosure.

Referring to FIG. 21, a plurality of electromagnetic attenuating lines EML may be provided in an input sensing part ISP-2. The plurality of the electromagnetic attenuating lines EML may be disposed between the guard line GRL and the ground line GNL. The offset signal OS illustrated in FIG. 17A may be applied to the electromagnetic attenuating lines EML.

Since the number of the electromagnetic attenuating lines EML is increased, the intensity of the electromagnetic signal from the offset signal OS may be increased. Accordingly, the electromagnetic signal generated from the input sensing part ISP may be more attenuated by the electromagnetic attenuating line EML.

Figure 22:
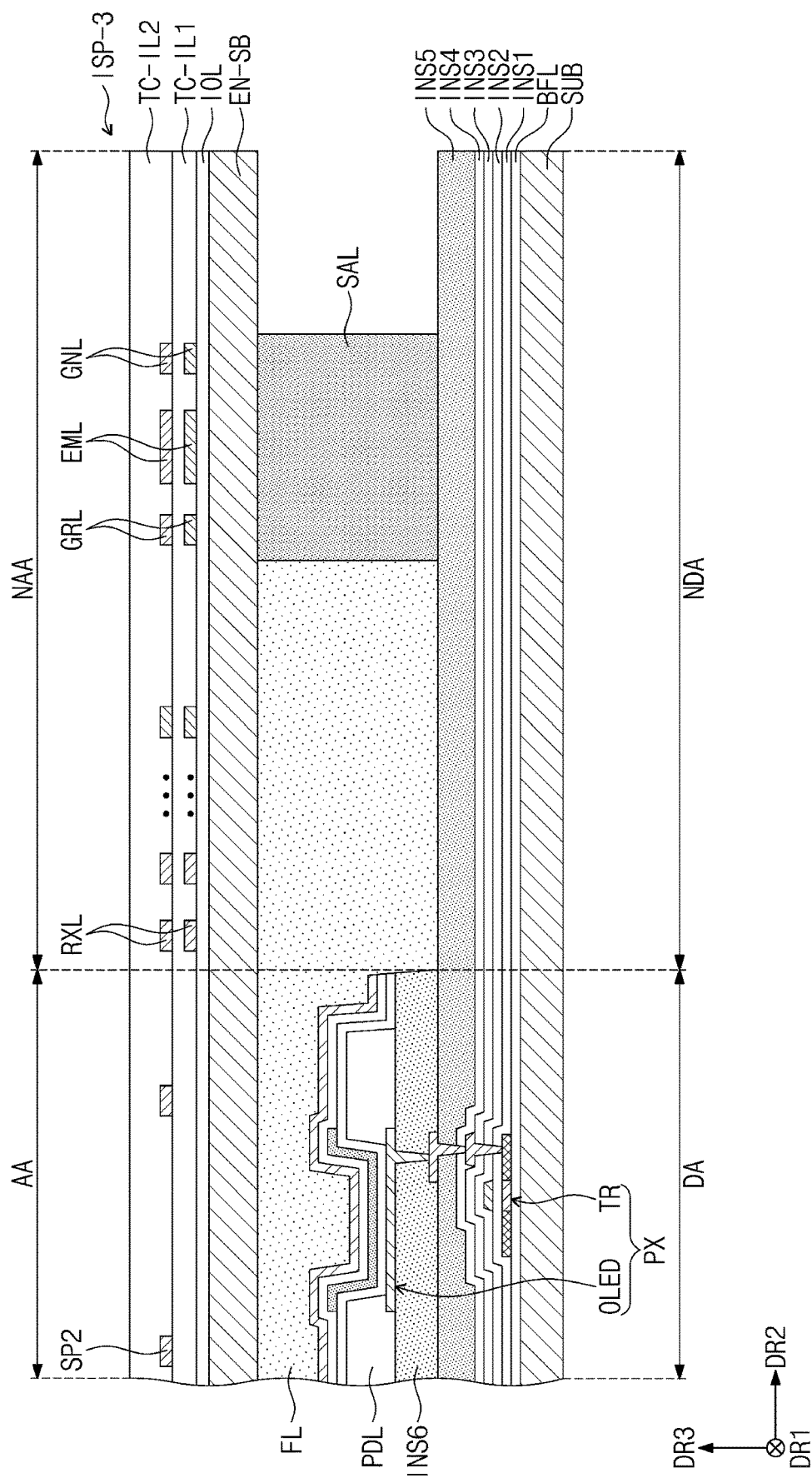

Referring to FIG. 22, a line width of an electromagnetic attenuating line EML of an input sensing part ISP-3 may be greater than a line width of each of the guard line GRL and the ground line GNL. The line width may indicate the numerical value measured in a direction crossing the extending direction of the line.

Since the line width of the electromagnetic attenuating line EML is increased, the intensity of the electromagnetic signal from the offset signal OS may be increased. Accordingly, the electromagnetic signal generated from the input sensing part ISP may be more attenuated by the electromagnetic attenuating line EML.

Figure 23:
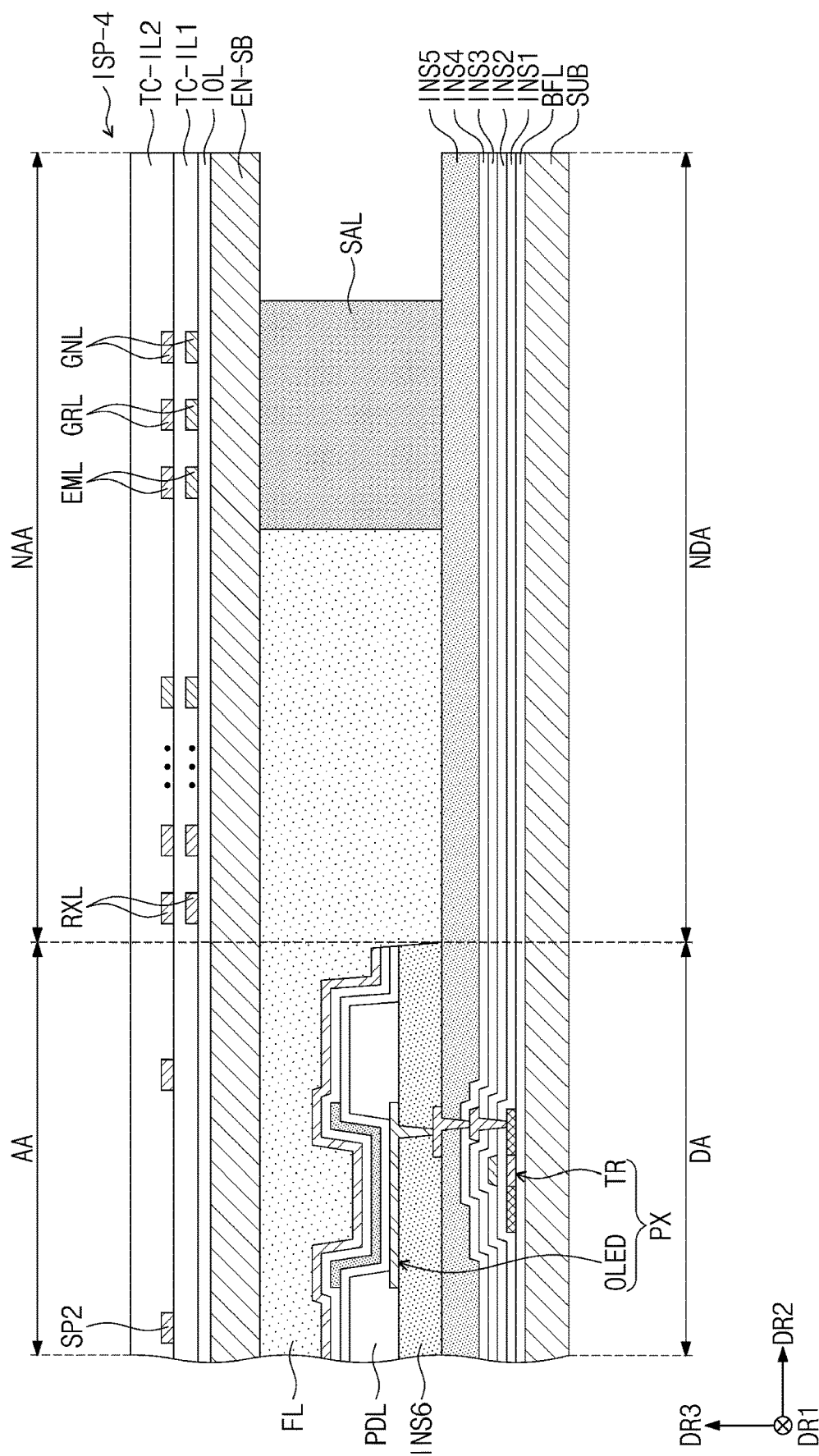

Referring to FIG. 23, an electromagnetic attenuating line EML of an input sensing part ISP-4 may be closer to the second sensing lines RXL, rather than the guard line GRL and the ground line GNL. The ground line GNL may be disposed at an outside of the guard line GRL, and the guard line GRL may be disposed between the electromagnetic attenuating line EML and the ground line GNL.

Figure 24:
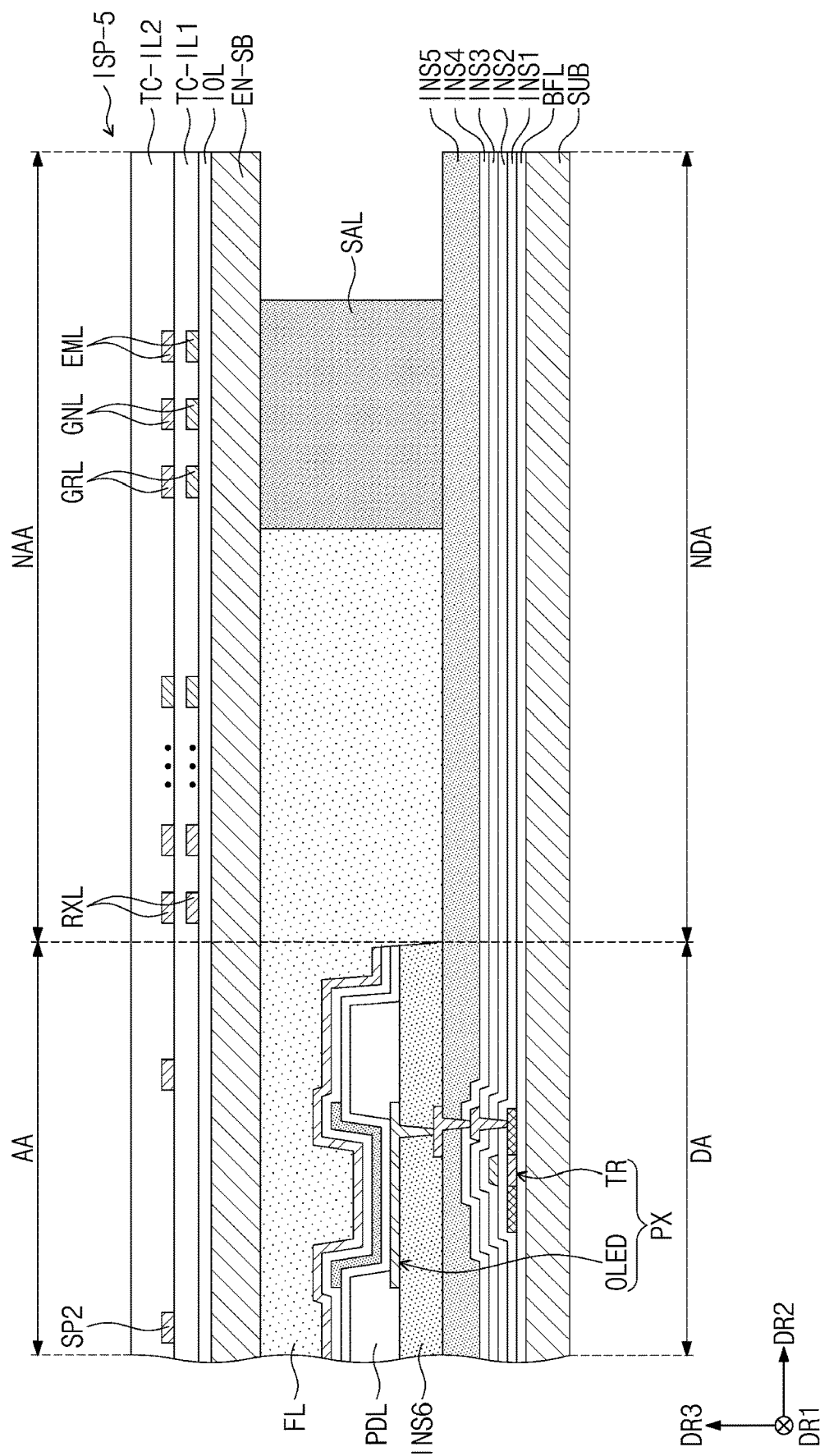

Referring to FIG. 24, an electromagnetic attenuating line EML of an input sensing part ISP-5 may be disposed at an outside of the guard line GRL and the ground line GNL. The guard line GRL may be closer to the second sensing lines RXL rather than the ground line GNL. The ground line GNL may be disposed between the ground line GNL and the electromagnetic attenuating line EML.

According to an embodiment of the present disclosure, the input sensing part may include the guard line, the ground line, and the electromagnetic attenuating line surrounding the active region, and the electromagnetic attenuating line may be disposed between the guard line and the ground line. The offset signal, which has a phase that is reverse to a phase of a driving signal applied to the sensing electrodes, and an amplitude greater than an amplitude of the driving signal, may be applied to the electromagnetic attenuating line. Accordingly, the electromagnetic signal generated from the input sensing part may be attenuated by the offset signal.

Although embodiments of the present disclosure have been described above with reference to the figures, it will be understood by those skilled in the art that various modifications and changes may be made to the described embodiments without departing from the spirit and scope of the present disclosure.

What is claimed is:
1. A display device, comprising:
a display panel; and
an input sensing part disposed on the display panel, the input sensing part including an active region and a non-active region at least partially surrounding the active region,
wherein the input sensing part further includes:
a plurality of sensing electrodes disposed within the active region;
a plurality of sensing lines connected to the plurality of sensing electrodes and disposed within the non-active region;
a guard line spaced apart from the plurality of sensing lines and disposed within the non-active region;
a ground line spaced apart from the plurality of sensing lines and disposed within the non-active region; and
an electromagnetic attenuating line spaced apart from the plurality of sensing lines and disposed within the non-active region.

2. The display device of claim 1, wherein the electromagnetic attenuating line is disposed between the guard line and the ground line.

3. The display device of claim 2, wherein a shortest distance between the guard line and the plurality of sensing lines is shorter than a shortest distance between the electromagnetic attenuating line and the plurality of sensing lines.

4. The display device of claim 1, wherein an offset signal applied to the electromagnetic attenuating line has a phase that is reverse with respect to a phase of a driving signal applied to the plurality of sensing electrodes.

5. The display device of claim 4, wherein the offset signal has an amplitude that is greater than an amplitude of the driving signal.

6. The display device of claim 1, wherein the guard line, the electromagnetic attenuating line, and the ground line each surround three out of four sides of the active region, and
wherein the guard line, the electromagnetic attenuating line, and the ground line are each electrically connected to pads disposed within the non-active region that is adjacent to a side of the active region that is not one of the three sides surrounded by the guard line, the electromagnetic attenuating line, and the ground line.

7. The display device of claim 5, wherein a portion of the guard line, a portion of the electromagnetic attenuating line, and a portion of the ground line are each open.

8. The display device of claim 1, wherein the guard line, the electromagnetic attenuating line, and the ground line each include multiple layers.

9. The display device of claim 1, wherein the display panel includes:
a substrate;
a display device layer disposed on the substrate;
an encapsulating substrate disposed on the display device layer; and
a sealing layer disposed between the substrate and the encapsulating substrate, the sealing layer sealing the display device layer, and overlapping the non-active region.

10. The display device of claim 9, wherein the guard line, the electromagnetic attenuating line, and the ground line each overlap the sealing layer.

11. The display device of claim 9, wherein none of the guard line, the electromagnetic attenuating line, and the ground line overlap the sealing layer.

12. The display device of claim 1, wherein the electromagnetic attenuating line is provided in plural.

13. The display device of claim 1, wherein a line width of the electromagnetic attenuating line is wider than a line width of each of the guard line and the ground line.

14. The display device of claim 1, wherein a shortest distance between the electromagnetic attenuating line and the plurality of sensing lines is shorter than each of a shortest distance between the guard line and the plurality of sensing lines and a shortest distance between the ground line and the plurality of sensing lines.

15. The display device of claim 1, wherein a shortest distance between the guard line and the plurality of sensing lines is shorter than a shortest distance between the ground line and the plurality of sensing lines.

16. An input sensing part, comprising:
a plurality of sensing electrodes disposed within an active region;
a plurality of sensing lines electrically connected to the plurality of sensing electrodes and disposed within a non-active region that at least partially surrounds the active region;
a guard line spaced apart from the plurality of sensing lines and disposed within the non-active region;
a ground line spaced apart from the plurality of sensing lines and disposed within the non-active region; and
an electromagnetic attenuating line spaced apart from the plurality of sensing lines and disposed within the non-active region,
wherein the electromagnetic attenuating line is disposed between the guard line and the ground line, and
wherein a shortest distance between the guard line and the plurality of sensing lines is shorter than a shortest distance between the electromagnetic attenuating line and the plurality of sensing lines.

17. The input sensing part of claim 16, wherein an offset signal applied to the electromagnetic attenuating line has a phase that is reverse with respect to a phase of a driving signal applied to the sensing electrodes, and
wherein the offset signal has an amplitude that is greater than an amplitude of the driving signal.

18. The input sensing part of claim 16, wherein a portion of the guard line, a portion of the electromagnetic attenuating line, and a portion of the ground line are open.

19. The input sensing part of claim 16, wherein the guard line, the electromagnetic attenuating line, and the ground line each include multiple layers.

20. A display device, comprising:
a display panel including a substrate, an encapsulating substrate disposed on the substrate, a display device layer disposed between the substrate and the encapsulating substrate, and a sealing layer disposed between the substrate and the encapsulating substrate and sealing the display device layer, and
an input sensing part disposed on the display panel,
wherein the input sensing part includes:
a plurality of sensing electrodes;
a plurality of sensing lines connected to the plurality of sensing electrodes;
a guard line spaced apart from the plurality of sensing lines;
a ground line spaced apart from the plurality of sensing lines; and
an electromagnetic attenuating line spaced apart from the plurality of sensing lines,
wherein the guard line, the ground line, and the electromagnetic attenuating line each overlap the sealing layer.

* * * * *